United States Patent
Lee et al.

(10) Patent No.: US 9,595,582 B2
(45) Date of Patent: Mar. 14, 2017

(54) LAYOUTS AND VERTICAL STRUCTURES OF MOSFET DEVICES

(71) Applicants: Jae-Hoon Lee, Daejeon (KR); Nok-Hyun Ju, Hwaseong-si (KR); Hyeong-Mo Yang, Seoul (KR); Sung-Ii Chang, Hwaseong-si (KR); Chan-Ho Lee, Anyang-si (KR)

(72) Inventors: Jae-Hoon Lee, Daejeon (KR); Nok-Hyun Ju, Hwaseong-si (KR); Hyeong-Mo Yang, Seoul (KR); Sung-Ii Chang, Hwaseong-si (KR); Chan-Ho Lee, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 190 days.

(21) Appl. No.: 14/630,885

(22) Filed: Feb. 25, 2015

(65) Prior Publication Data
US 2015/0372085 A1  Dec. 24, 2015

(30) Foreign Application Priority Data
Jun. 20, 2014  (KR) .................. 10-2014-0075863

(51) Int. Cl.
*H01L 29/78* (2006.01)
*H01L 29/06* (2006.01)
(Continued)

(52) U.S. Cl.
CPC ...... *H01L 29/0692* (2013.01); *H01L 27/0207* (2013.01); *H01L 27/088* (2013.01);
(Continued)

(58) Field of Classification Search
CPC ... H01L 29/00; H01L 29/42; H01L 29/42376; H01L 29/78; H01L 29/66;
(Continued)

(56) References Cited

U.S. PATENT DOCUMENTS 8,357,966 B2  1/2013  Minemura et al.
8,624,314 B2  1/2014  Minemura et al.
(Continued)

FOREIGN PATENT DOCUMENTS

JP  2011-199199  10/2011
KR  1020060074231 A  7/2006
KR  1020100131718 A  12/2010

*Primary Examiner* — Monica D Harrison
(74) *Attorney, Agent, or Firm* — Myers Bigel, P.A.

(57) ABSTRACT

A metal-oxide-semiconductor field-effect transistor device includes a first active area, a first gate electrode configured to cross the first active area and extend in a Y direction, and define a first source area and a first drain area, first gate contacts disposed on the first gate electrode to align on a first virtual gate passing line extending in the Y direction, first source contacts disposed on the first source area to align on a first virtual source passing line extending in the Y direction, and first drain contacts disposed on the first drain area to align on a first virtual drain passing line extending in the Y direction, wherein at least one of the first drain contacts is disposed to align on any one of first virtual X-straight lines configured to pass between the first source contacts and extend parallel in an X direction perpendicular to the Y direction.

20 Claims, 27 Drawing Sheets

(51) Int. Cl.
*H01L 27/088* (2006.01)
*H01L 29/417* (2006.01)
*H01L 29/423* (2006.01)
*H01L 27/02* (2006.01)
*H01L 27/115* (2006.01)

(52) U.S. Cl.
CPC .... *H01L 29/41775* (2013.01); *H01L 29/4238* (2013.01); *H01L 29/78* (2013.01); *H01L 27/11582* (2013.01)

(58) Field of Classification Search
CPC .............. H01L 29/665; H01L 29/6656; H01L 29/6659; H01L 29/783; H01L 29/7833; H01L 21/82; H01L 21/823; H01L 21/823807
USPC ................................................ 257/288, 387
See application file for complete search history.

(56) References Cited

U.S. PATENT DOCUMENTS

| | | | |
|---|---|---|---|
| 9,059,282 B2* | 6/2015 | Hodel | H01L 27/0207 |
| 2006/0141710 A1 | 6/2006 | Yoon et al. | |
| 2009/0191681 A1 | 7/2009 | Yoon et al. | |
| 2013/0015509 A1* | 1/2013 | Haran | H01L 29/6653 |
| | | | 257/288 |
| 2013/0240997 A1 | 9/2013 | Anderson et al. | |
| 2015/0243751 A1* | 8/2015 | Liu | H01L 21/76834 |
| | | | 257/288 |

* cited by examiner

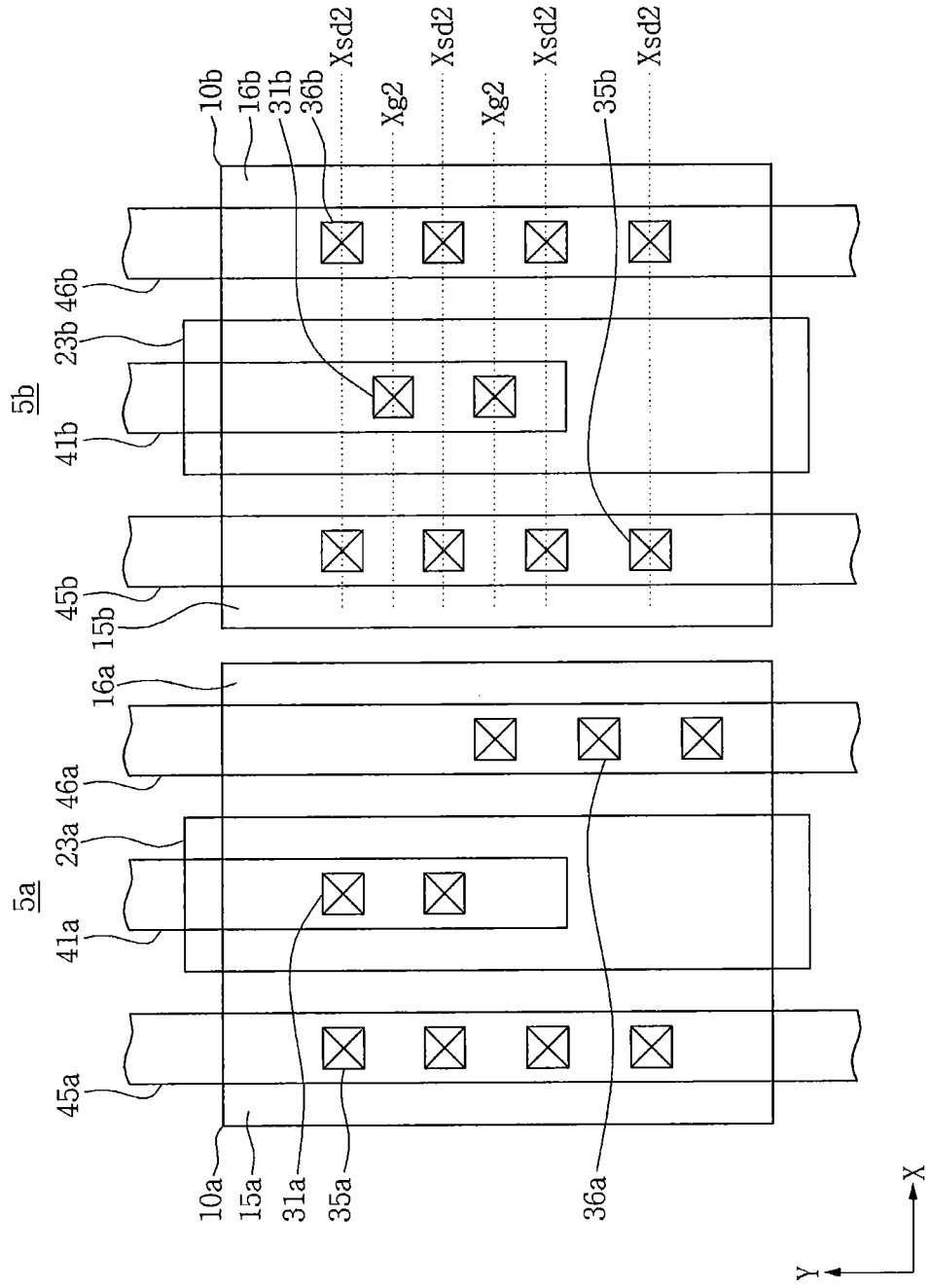

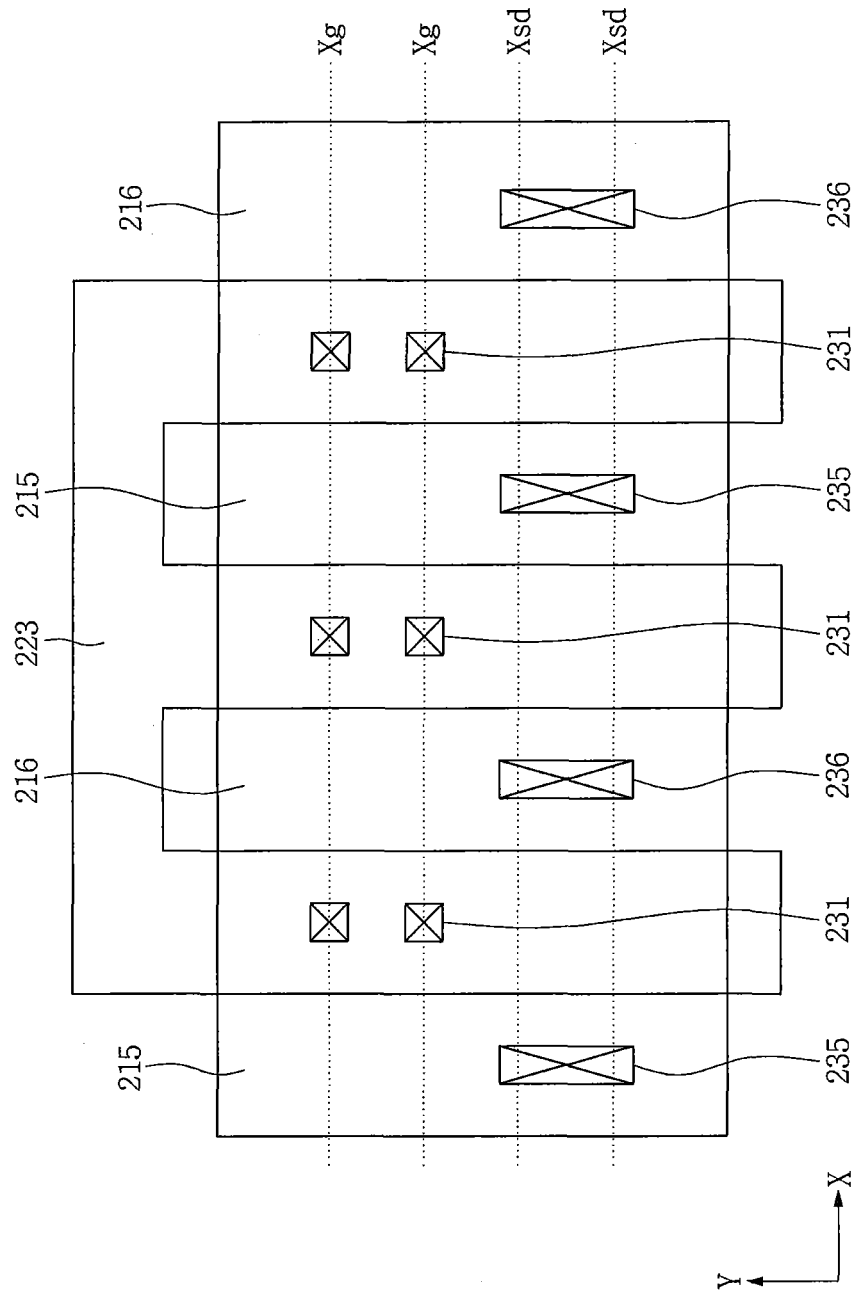

LAYOUTS AND VERTICAL STRUCTURES OF MOSFET DEVICES

CROSS-REFERENCE TO RELATED APPLICATION

This application claims priority under 35 U.S.C. §119 to Korean Patent Application No. 10-2014-0075863, filed on Jun. 20, 2014, the disclosure of which is hereby incorporated by reference in its entirety.

BACKGROUND

Field

Embodiments of the inventive concepts relate to layouts and vertical structures of metal-oxide-semiconductor field-effect transistor (MOSFET) devices.

Description of Related Art

As metal-oxide-semiconductor field-effect transistor (MOSFET) devices are reduced in size, an influence of a parasitic capacitance between the closely spaced contacts during operation of the MOSFET devices is increasing.

SUMMARY

Embodiments of the inventive concepts provide layouts of metal-oxide-semiconductor field-effect transistor (MOSFET) devices.

Other embodiments of the inventive concepts provide vertical structures of the MOSFET devices.

The technical objectives of the inventive concepts are not limited to the above disclosure; other objectives may become apparent to those of ordinary skill in the art based on the following descriptions.

In accordance with an aspect of the inventive concepts, a MOSFET device having a layout may include a first active area; a first gate electrode that extends in a Y direction to cross the first active area and to define a first source area and a first drain area in the first active area; first gate contacts on the first gate electrode that are aligned on a first virtual gate passing line that extends in the Y direction; first source contacts on the first source area that are aligned on a first virtual source passing line that extends in the Y direction; and first drain contacts on the first drain area that are aligned on a first virtual drain passing line that extends in the Y direction. At least one of the first drain contacts is on any one of first virtual lines that extend in parallel in an X direction and that each pass between two adjacent ones of the first source contacts, wherein the X direction is perpendicular to the Y direction.

In an embodiment, the MOSFET device may further include a second active area that is adjacent the first active area; a second gate electrode that extends in a Y direction to cross the second active area and to define a second source area and a second drain area in the second active area; second gate contacts on the second gate electrode that are aligned on a second virtual gate passing line that extends in the Y direction; second source contacts on the second source area that are aligned on a second virtual source passing line that extends in the Y direction; and second drain contacts on the second drain area that are aligned on a second virtual drain passing line that extends in the Y direction. At least one of the second drain contacts may be on any one of the second virtual lines.

In accordance with another aspect of the inventive concepts, a MOSFET device includes an active area; a gate electrode that extends in a Y direction to cross the active area and to define a source area and a drain area in the active area; source contacts extending in the Y direction on the source area; and drain contacts extending in the Y direction on the drain area.

In accordance with still another aspect of the inventive concepts, a MOSFET device may include an active area; a gate electrode that extends in a Y direction to cross the active area and to define a source area and a drain area; gate contacts on the gate electrode; and first drain contacts on the drain area.

In accordance with yet another aspect of the inventive concepts, a MOSFET device may include an active area; first to third gate electrodes that extend in parallel in a Y direction to cross the active area and to define a first source area, a first drain area, a second source area, and a second drain area; first source contacts in the first source area and second source contacts in the second source area; and first drain contacts in the first drain area and second drain contacts in the second drain area.

In accordance with yet another aspect of the inventive concepts, a MOSFET device may include an active area; a gate electrode that extends in a Y direction to cross the active area and to define a source area and a drain area; gate contacts on the gate electrode to align in the Y direction; source contacts on the source area to align in the Y direction; and drain contacts on the drain area to align in the Y direction, wherein the gate contacts may overlap any one of the source contacts and the drain contacts in an X direction that is perpendicular to the Y direction.

In accordance with yet another aspect of the inventive concepts, a MOSFET device may include a first active area, a first gate electrode that extends in a Y direction to cross the first active area, the first gate electrode defining a first source area and a first drain area in the first active area, first gate contacts on the first gate electrode, the first gate contacts aligned on a first virtual gate passing line that extends in the Y direction, first source contacts on the first source area, the first source contacts aligned on a first virtual source passing line that extends in the Y direction, and first drain contacts on the first drain area, the first drain contacts aligned on a first virtual drain passing line that extends in the Y direction. Distances from one of the first gate contacts to the two first source contacts that are closest to the one of the first gate contacts are substantially the same.

In accordance with yet another aspect of the inventive concepts, a MOSFET device may include a first active area, a first gate electrode that extends in a Y direction to cross the first active area, the first gate electrode defining a first source area and a first drain area in the first active area, first gate contacts on the first gate electrode, the first gate contacts aligned on a first virtual gate passing line that extends in the Y direction, first source contacts on the first source area, the first source contacts aligned on a first virtual source passing line that extends in the Y direction, and first drain contacts on the first drain area, the first drain contacts aligned on a first virtual drain passing line that extends in the Y direction. At least some of the first source contacts is aligned in an X direction that is perpendicular to the Y direction with a respective one of the first drain contacts, and wherein the first gate contacts are not aligned in the X direction with either the first source contacts or the first drain contacts.

Details of other embodiments are included in detailed explanations and the drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings, in which like reference characters refer to the same parts throughout the different views. The drawings are not necessarily to scale, emphasis instead being placed upon illustrating the principles of the inventive concepts. In the drawings:

FIGS. 2A to 2J are layouts of MOSFET devices in accordance with further embodiments of the inventive concepts;

FIGS. 4A to 4E are layouts of MOSFET devices in accordance with additional embodiments of the inventive concepts;

DETAILED DESCRIPTION OF THE EMBODIMENTS

Figure 1A:
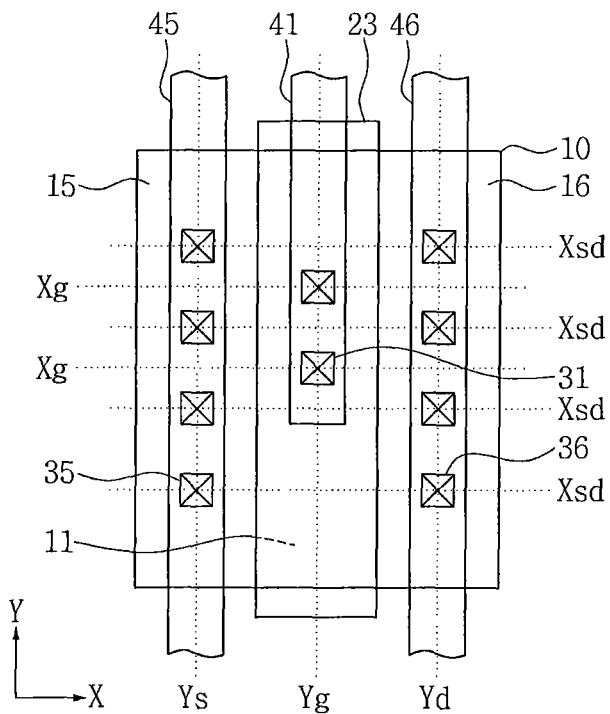
FIGS. 1A to 1L are layouts showing MOSFET devices in accordance with various embodiments of the inventive concepts.

In the description that follows, embodiments of the present invention are primarily described with reference to "layouts" which refer to plan view diagrams of the devices or, in other words, a view of each device from above looking down towards a top surface of a substrate of the device along an axis that is perpendicular to the top surface of the substrate. The devices are also described in terms an "X direction" and a "Y direction," which are directions that are parallel to the top surface of the substrate and perpendicular to each other. In the description that follows, the −Y direction refers to a downward direction in the drawings (i.e., towards the bottom of the drawing sheet) and a +Y direction refers to an upward direction to facilitate an understanding of the inventive concepts. In the description that follows, two elements "vertically overlap" if an axis that is perpendicular to the top surface of the substrate passes through both elements.

In an aspect of the inventive concepts, MOSFET devices may have symmetrical shapes, structures, and characteristics. For example, sources and drains may be compatible with each other in embodiments of the inventive concepts. Therefore, locations and characteristics of source contacts may be compatible with locations and characteristics of drain contacts.

FIGS. 1A to 1L are layouts showing MOSFET devices in accordance with various embodiments of the inventive concepts.

Referring to FIG. 1A, a MOSFET device in accordance with an embodiment of the inventive concepts includes an active area 10, a gate electrode 23 that extends in a Y direction to cross the active area 10, a source area 15 and a drain area 16 that are defined by the gate electrode 23, a plurality of gate contacts 31 that vertically overlap the gate electrode 23, a plurality of source contacts 35 that vertically overlap the source area 15, and a plurality of drain contacts 36 that vertically overlap the drain area 16. The MOSFET device may include a gate interconnection 41 that vertically overlaps the gate electrode 23 and the gate contacts 31, a source interconnection 45 that vertically overlaps the source area 15 and the source contacts 35, and a drain interconnection 46 that vertically overlaps the drain area 16 and the drain contacts 36. A portion of the active area 10 that vertically overlaps the gate electrode 23 may be a channel area 11.

The active area 10 may have, for example, a tetragonal shape.

The gate electrode 23 may have a bar or line shape that extends in the Y direction to cross a middle portion of the active area 10.

The source area 15 may be a part of the active area 10 that is on a first side of the gate electrode 23, and the drain area 16 may be another part of the active area 10 that is on a second side of the gate electrode 23 that is opposite the first side. The source area 15 and the drain area 16 may be disposed symmetrically about a line that bisects the gate electrode 23 in the Y direction. For example, the source area 15 and the drain area 16 may have substantially the same shape and area. The source area 15 and the drain area 16 may have shapes that are elongated in the Y direction.

The gate contacts 31, the source contacts 35, and the drain contacts 36 may be disposed on a virtual gate passing line Yg, a virtual source passing line Ys, and a virtual drain passing line Yd, respectively, each of which extend in the Y direction. For example, the virtual gate passing line Yg may pass through the gate electrode 23 and the channel area 11 in the Y direction, the virtual source passing line Ys may pass through the source area 15 in the Y direction, and the virtual drain passing line Yd may pass through the drain area 16 in the Y direction. The virtual passing lines Yg, Ys, and Yd may substantially cross through centers of the gate contacts 31, the source contacts 35, and the drain contacts 36, respectively, as shown in FIG. 1A.

The source contacts 35 and the drain contacts 36 may be disposed on virtual source/drain contact crossing lines Xsd that extend in parallel to each other in an X direction. For example, one of the source contacts 35 and one of the drain contacts 36 may each be disposed on one of the virtual source/drain contact crossing lines Xsd.

The source contacts 35 and the drain contacts 36 may be disposed symmetrically about a line that bisects the gate electrode 23 in the Y direction. For example, a distance between each source contact 35 and the gate electrode 23 may be the same as a distance between each drain contact 36 and the gate electrode 23.

The gate contacts 31 are not disposed on the virtual source/drain contact crossing lines Xsd. Instead, the gate contacts 31 may be disposed on respective ones of virtual gate contact crossing lines Xg that extend in parallel to each other in the X direction. Each virtual gate contact crossing line Xg may be shifted in a −Y direction (or +Y direction) from the virtual source/drain contact crossing lines Xsd. For example, each virtual gate contact crossing line Xg may pass between two adjacent ones of the source contacts 35 and/or between two adjacent ones of the drain contacts 36. Thus, the gate contacts 31 may not be aligned with the source contacts 35 or the drain contacts 36 in the X direction.

The gate contacts 31 each may be spaced apart from the two source contacts 35 that are closest thereto by substantially the same distance, and may be spaced apart from the two adjacent drain contacts 36 that are closest thereto by substantially the same distance.

The gate contacts 31, the source contacts 35, and the drain contacts 36 may be substantially the same size.

The gate contacts 31 and the source contacts 35 may be disposed in a zigzag pattern in both the X direction and in the Y direction. Likewise, the gate contacts 31 and the drain contacts 36 may be disposed in a zigzag pattern in both the X direction and in the Y direction.

The gate interconnection 41, the source interconnection 45, and the drain interconnection 46 may extend in parallel to each other along the virtual gate passing line Yg, the virtual source passing line Ys, and the virtual drain passing line Yd, respectively. The gate interconnection 41 may extend in parallel to the gate electrode 23, and may overlap the gate electrode 23. The source interconnection 45 may extend in parallel to the source area 15, and may overlap the source area 15. The drain interconnection 46 may extend in parallel to the drain area 16, and may overlap the drain area 16.

Since the MOSFET device of FIG. 1A includes the gate contacts 31, the source contacts 35, and the drain contacts 36, which are disposed in a zigzag pattern in both the X direction and in the Y direction, minimum distances between the gate contacts 31 and the source contacts 35, and minimum distances between gate contacts 31 and the drain contacts 36 may be increased. Therefore, a parasitic capacitance between the contacts 31, 35, and 36 may be reduced, the length of the contacts 31, 35, and 36 in the X direction may be increased, and/or process margins for forming the contacts 31, 35, and 36 may be increased.

Figure 1B:
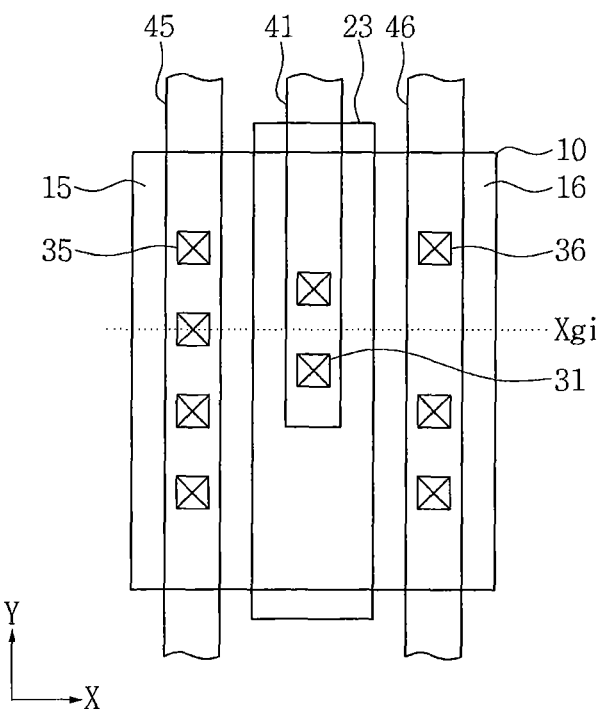

Referring to FIG. 1B, in a MOSFET device in accordance with another embodiment of the inventive concepts, the drain contact 36 of the embodiment of FIG. 1A that was disposed on a virtual inter-gate contact line Xgi that extends in the X direction and that passes between the two adjacent gate contacts 31 is omitted. The virtual inter-gate contact line Xgi may cross at a mid-point between the two adjacent gate contacts 31.

In the embodiment of FIG. 1B, a total number of the drain contacts 36 may be less than a total number of the source contacts 35 by a total number of gaps between adjacent gate contacts 31. The number of omitted drain contacts 36 may be the number of gaps between adjacent gate contacts 31. The total number of gaps between adjacent gate contacts 31 may be one less than a total number of gate contacts 31. A parasitic capacitance between the gate contacts 31 and the drain contacts 36 may be further reduced in the embodiment of FIG. 1B.

Figure 1C:
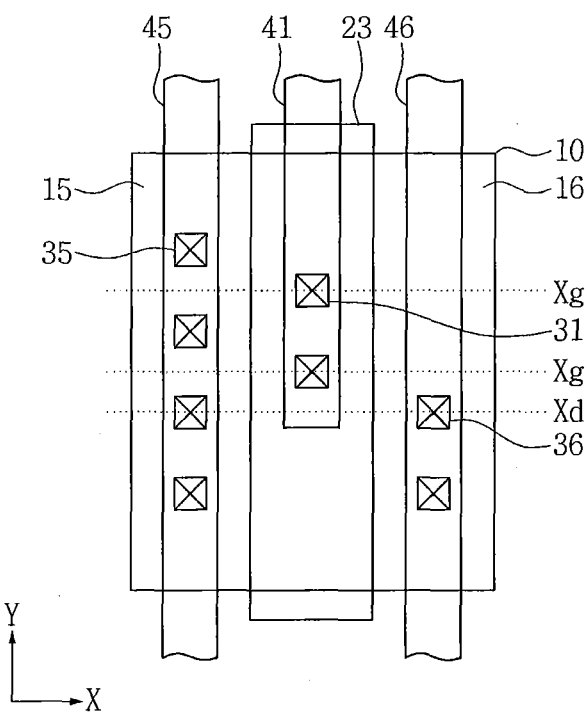

Referring to FIG. 1C, in a MOSFET device in accordance with yet another embodiment of the inventive concepts, the drain contacts 36 may be disposed only in a lower portion of the drain area 16 in the Y direction.

For example, the drain contacts 36 may be disposed only in the lower portion of the drain area 16, which is at a lower level than all of the virtual gate contact crossing lines Xg that extend in the X direction to cross the gate contacts 31. In other words, the drain contacts 36 may be located in the −Y direction as compared to the gate contacts 31. Further, virtual drain contact crossing lines Xd that extend in the X direction to cross the drain contacts 36 may be disposed at a lower level than the virtual gate contact crossing lines Xg and hence may be located in the −Y direction with respect to the virtual gate contact crossing lines Xg.

A total number of drain contacts 36 may be less than a total number of source contacts 35 by a total number of the gate contacts 31. A parasitic capacitance between the gate contacts 31 and the drain contacts 36 may be further reduced.

Figure 1D:
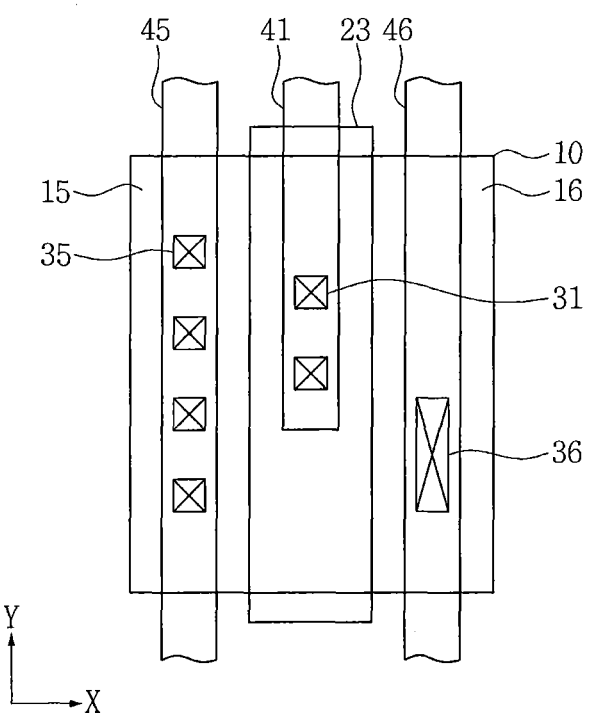

Referring to FIG. 1D, in a MOSFET device in accordance with still another embodiment of the inventive concepts, the drain contacts 36 disposed in the lower area of the drain area 16 may have a bar shape or a rectangular shape that is elongated in the Y direction, as compared to the drain contacts 36 in the embodiments of FIGS. 1A-1C.

For example, the MOSFET device of FIG. 1D may include different numbers of source contacts 35 and drain contacts 36. The source contacts 35 may have a square or circular shape, and the drain contacts 36 may have a bar shape, a rectangular shape or an oval shape. The bar, rectangular or oval shaped drain contacts 36 may have reduced resistance.

Figure 1E:
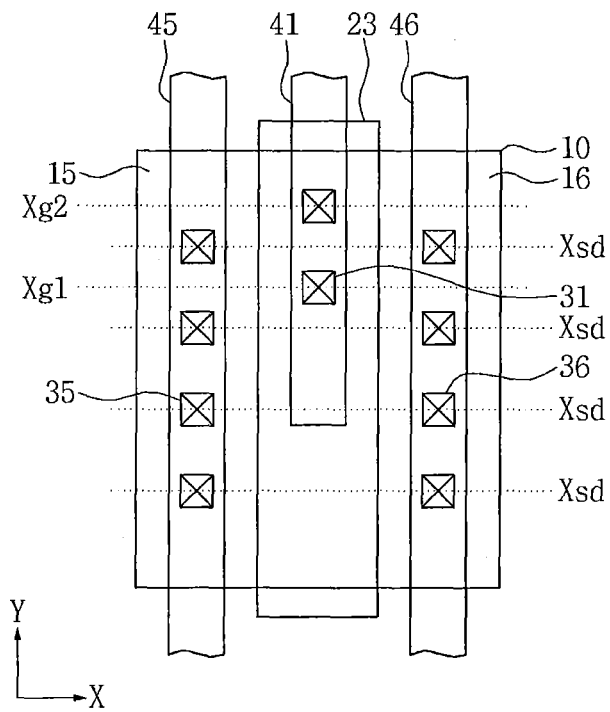

Referring to FIG. 1E, in a MOSFET device in accordance with yet another embodiment of the inventive concepts, the gate contacts 31 each may be disposed on a first virtual gate contact crossing line Xg1 that extends in the X direction to pass between two adjacent source contacts 35 and between two adjacent drain contacts 36, and on a second virtual gate contact crossing line Xg2 that is parallel to the first virtual gate contact crossing line Xg1 and that is shifted from a last one of the source contacts 35 and/or a last one of the drain contacts 36 in the +Y direction. Thus, the gate contacts 31 may be shifted in the +Y direction so as not to be disposed on the same virtual source/drain contact crossing lines Xsd as the source contacts 35 and/or the drain contacts 36 in the X direction.

The gate contacts 31 and the source contacts 35 may be disposed in a zigzag pattern in the X direction and/or in the Y direction. The gate contacts 31 and the drain contacts 36 may also be disposed in a zigzag pattern in the X direction and/or in the Y direction.

Figure 1F:
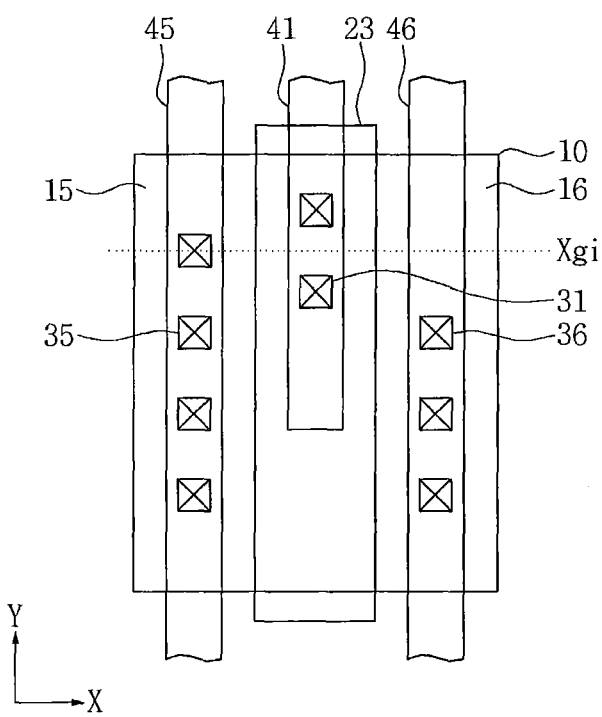

Referring to FIG. 1F, in a MOSFET device in accordance with another embodiment of the inventive concepts, no drain contact 36 may be disposed on a virtual inter-gate contact line Xgi that extends in the X direction to pass between two adjacent gate contacts 31.

For example, the drain contact 36 in the embodiment of FIG. 1E that is disposed on the virtual inter-gate contact line Xgi that extends in the X direction to cross between the two adjacent gate contacts 31 is omitted in the embodiment of FIG. 1F.

Figure 1G:
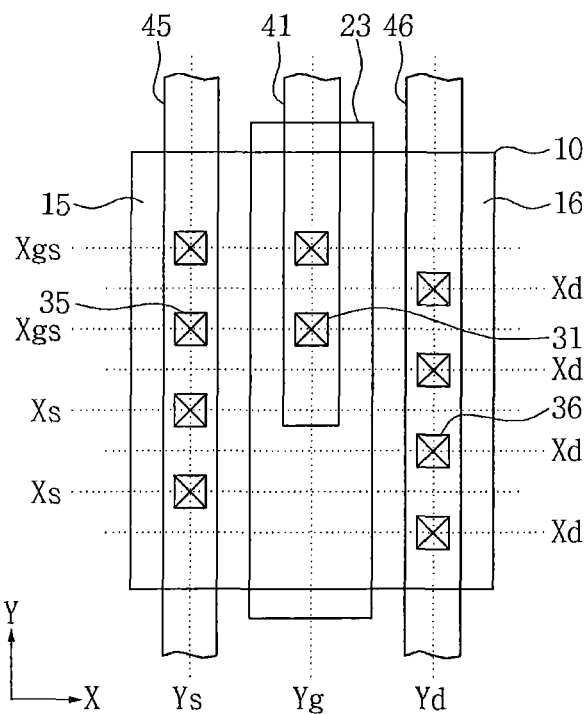

Referring to FIG. 1G, a MOSFET device in accordance with yet another embodiment of the inventive concepts may include a gate electrode 23 that crosses an active area 10 to define a source area 15 and a drain area 16, a plurality of gate contacts 31 that are disposed on the gate electrode 23 to overlap the gate electrode 23, a plurality of source contacts 35 that are disposed on the source area 15 to overlap the source area 15, a plurality of drain contacts 36 that are disposed on the drain area 16 to overlap the drain area 16, a gate interconnection 41 that extends parallel to the gate electrode 23 to overlap the gate electrode 23 and the gate contacts 31, a source interconnection 45 that extends parallel to the gate electrode 23 to overlap the source area 15 and the source contacts 35, and a drain interconnection 46 that extends parallel to the gate electrode 23 to overlap the drain area 16 and the drain contacts 36. The gate contacts 31 may be aligned and disposed on virtual gate/source contact crossing lines Xgs that extend in the X direction to cross the source contacts 35, and the drain contacts 36 may be disposed on virtual drain contact crossing lines Xd that extend in the X direction to cross between two adjacent source contacts 35.

For example, the drain contacts 36 each may be shifted in a −Y direction with respect to the source contacts 35 so that the drain contacts 36 are not disposed on the virtual gate/source contact crossing lines Xgs and/or on virtual source contact crossing lines Xs. The drain contacts 36 thus do not overlap the source contacts 35 and/or the gate contacts 31 in the X direction. The drain contacts 36 may overlap spaces between the gate contacts 31 and/or spaces between the source contacts 35 in the X direction.

The gate contacts 31 each may be disposed on the virtual gate/source contact crossing lines Xgs in the X direction, and on a virtual gate passing line Yg in the Y direction. The source contacts 35 may be disposed on the virtual gate/source contact crossing lines Xgs and/or the virtual source contact crossing lines Xs in the X direction, and on a virtual source passing line Ys in the Y direction. The source contacts 35 and the drain contacts 36 and/or the gate contacts 31 and the drain contacts 36 may be disposed in a zigzag pattern in the X direction and/or in the Y direction.

When the source contacts 35 are grounded by a ground voltage, a parasitic capacitance between the gate contacts 31 and the source contacts 35 may be negligibly low. Therefore, when the source contacts 35 are grounded by the ground voltage, only distances between the gate contacts 31 and the source contacts 35 may be adjusted.

Figure 1H:
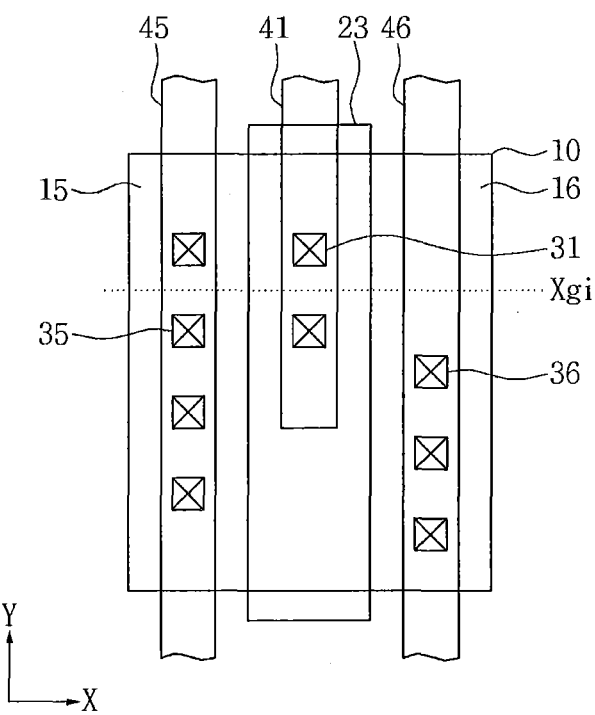

Referring to FIG. 1H, in a MOSFET device in accordance with a further embodiment of the inventive concepts, the drain contact 36 in the embodiment of FIG. 1G that is disposed on the virtual inter-gate contact line Xgi that crosses between the gate contacts 31 in the X direction is omitted. Accordingly, the drain contacts 36 may be disposed only in a lower portion of the drain area 16 located in the −Y direction compared to a lowermost one of the gate contacts 31.

Figure 1I:
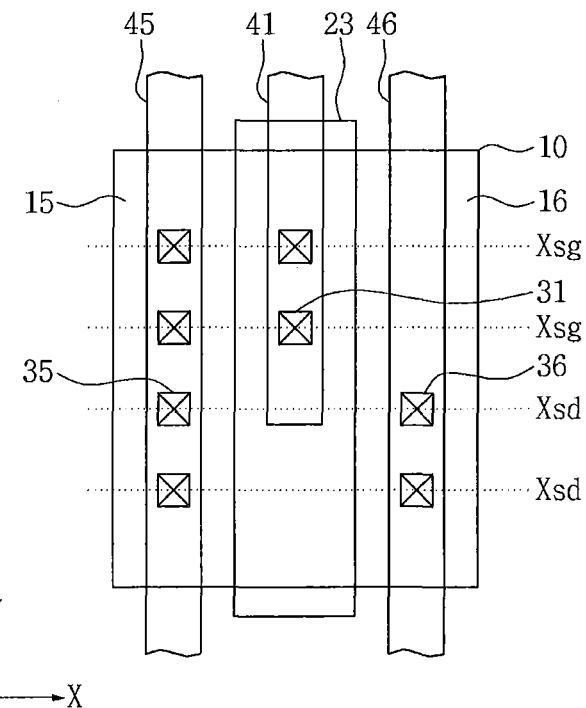

Referring to FIG. 1I, in a MOSFET device in accordance with yet an additional embodiment of the inventive concepts, the gate contacts 31, the source contacts 35, and the drain contacts 36 each may be disposed on a plurality of virtual gate/source contact crossing lines Xgs and/or virtual source/drain contact crossing lines Xsd, which extend in parallel in the X direction.

The drain contacts 36 may not be disposed on the virtual gate/source contact crossing lines Xgs that extend in the X direction to cross the gate contacts 31. The gate contacts 31 may not be disposed on the virtual source/drain contact crossing lines Xsd that extend in the X direction to cross the source contacts 35 and the drain contacts 36. For example, only one of the gate contacts 31 and the drain contacts 36 may be exclusively disposed on the virtual gate/source contact crossing lines Xgs and/or virtual source/drain contact crossing lines Xsd. Thus, the drain contacts 36 may be disposed only in a lower portion of the drain area 16 located in the −Y direction compared to the lowermost one of the gate contacts 31.

Figure 1J:
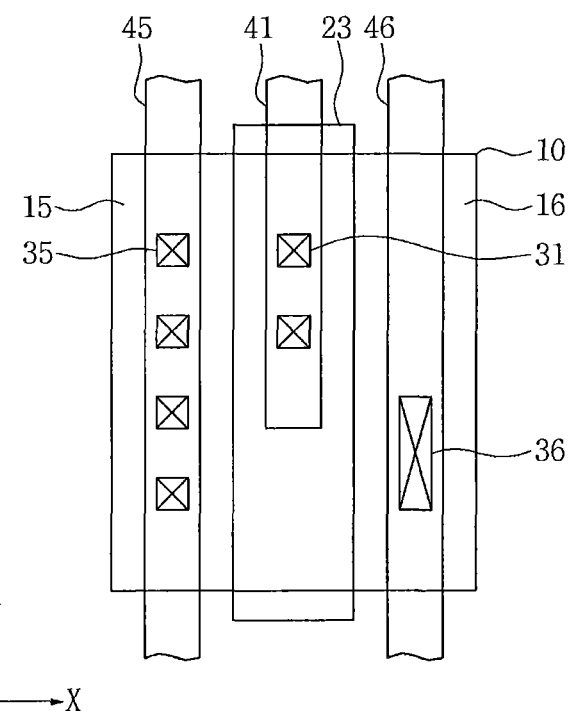

Referring to FIG. 1J, in a MOSFET device in accordance with yet another embodiment of the inventive concepts, the drain contacts 36 disposed in the lower portion of the drain area 16 located in the −Y direction compared to the lowermost one of the gate contacts 31 may have a bar shape, a rectangular shape or an oval shape.

Figure 1K:
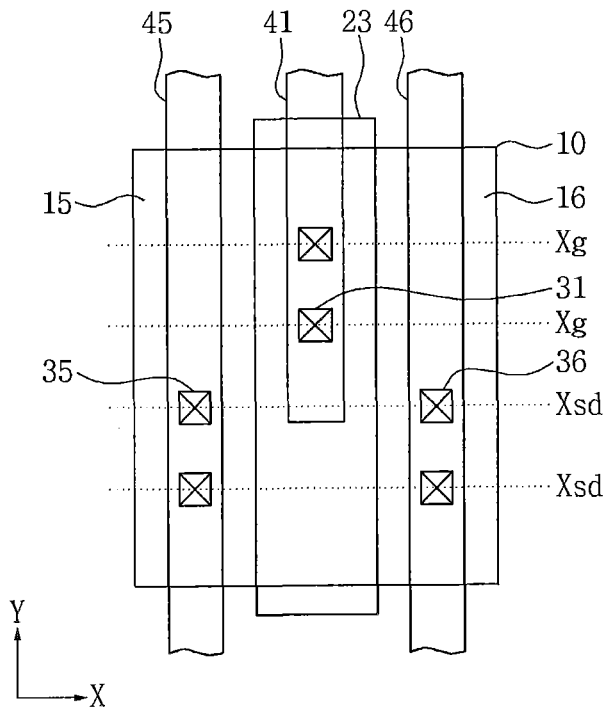

Referring to FIG. 1K, a MOSFET device in accordance with still another embodiment of the inventive concepts may include a gate electrode 23 that crosses an active area 10 to define a source area 15 and a drain area 16, a plurality of gate contacts 31 disposed on the gate electrode 23 to overlap the gate electrode 23, a plurality of source contacts 35 disposed on the source area 15 to overlap the source area 15, a plurality of drain contacts 36 disposed on the drain area 16 to overlap the drain area 16, a gate interconnection 41 that extends parallel to the gate electrode 23 to overlap the gate electrode 23 and the gate contacts 31, a source interconnection 45 that extends parallel to the gate electrode 23 to overlap the source area 15 and the source contacts 35, and a drain interconnection 46 that extends parallel to the gate electrode 23 to overlap the drain area 16 and the drain contacts 36. The source contacts 35 and the drain contacts 36 may be disposed on virtual source/drain contact crossing lines Xsd that extend in the X direction.

A source contact 35 and a drain contact 36 may be commonly disposed on each of the virtual source/drain contact crossing lines Xsd.

The gate contacts 31 may not overlap the source contacts 35 and/or the drain contacts 36 in the X direction.

The source contacts 35 and the drain contacts 36 may be disposed only in portions of the source area 15 and the drain area 16 that are located in the −Y direction as compared to a lowermost of the gate contacts 31 in the Y direction. For example, the gate contacts 31 may be disposed in an upper portion of the active area 10, and the source contacts 35 and the drain contacts 36 may be disposed in a lower portion of the active area 10.

The virtual source/drain contact crossing lines Xsd which cross the source contacts 35 and the drain contacts 36, and the virtual gate contact crossing lines Xg which cross the gate contacts 31, may be disposed in parallel to each other and may extend in the X direction. The virtual source/drain contact crossing lines Xsd and the virtual gate contact crossing lines Xg may be spaced apart from adjacent ones of the virtual source/drain contact crossing lines Xsd and/or adjacent ones of the virtual gate contact crossing lines Xg by the same distance in the Y direction.

A total number of the source contacts 35 and a total number of the drain contacts 36 may be the same.

Figure 1L:
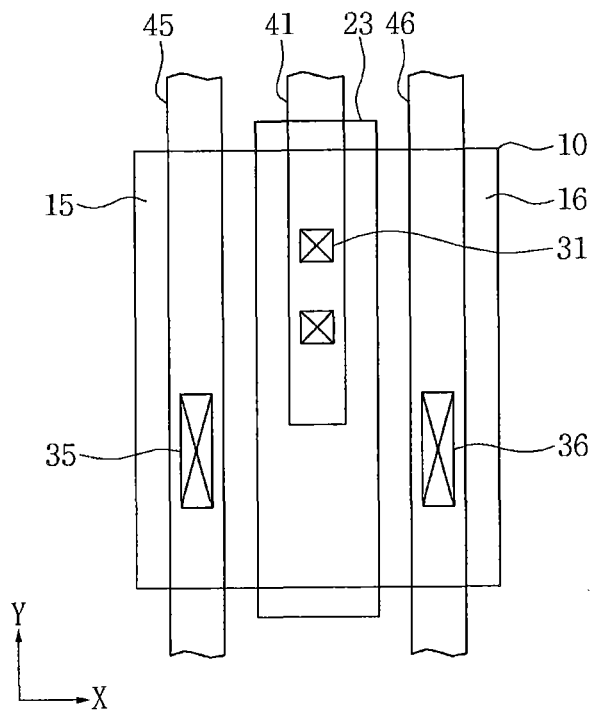

Referring to FIG. 1L, in a MOSFET device in accordance with another embodiment of the inventive concepts, the source contacts 35 are disposed in the lower area of the source area 15 and the drain contacts 36 are disposed in the lower area of the drain area 16 may have a bar shape, a rectangular shape or an oval shape.

FIGS. 2A to 2J are layout diagrams showing MOSFET devices in accordance with various embodiments of the inventive concepts.

Figure 2A:
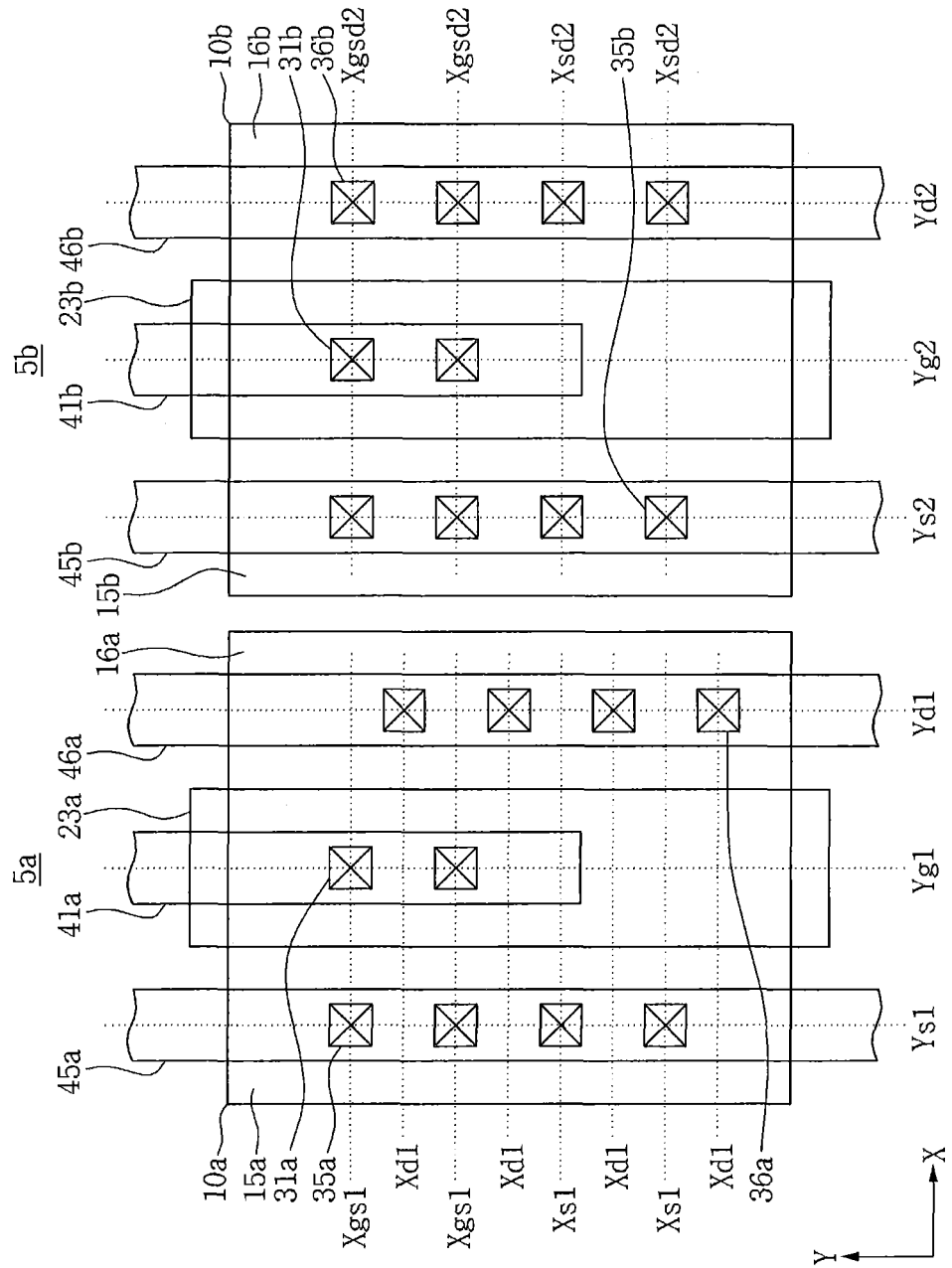

Referring to FIG. 2A, a MOSFET device in accordance with an embodiment of the inventive concepts may include a first MOSFET device 5a and a second MOSFET device 5b.

The first MOSFET device 5a may include a first active area 10a, a first gate electrode 23a that crosses the first active area 10a in the Y direction to define a first source area 15a and a first drain area 16a, first source contacts 35a disposed on the first source area 15a, first drain contacts 36a disposed on the first drain area 16a, and first gate contacts 31a disposed on the first gate electrode 23a. The first MOSFET device 5a may further include a first gate interconnection 41a that vertically overlaps the first gate electrode 23a and the first gate contacts 31a, a first source interconnection 45a that vertically overlaps the first source area 15a and the first source contacts 35a, and a first drain interconnection 46a that vertically overlaps the first drain area 16a and the first drain contacts 36a.

The second MOSFET device 5b may include a second active area 10b, a second gate electrode 23b that crosses the second active area 10b in the Y direction to define a second source area 15b and a second drain area 16b, second source contacts 35b disposed on the second source area 15b, second drain contacts 36b disposed on the second drain area 16b, and second gate contacts 31b disposed on the second gate electrode 23b. The second MOSFET device 5b may further include a second gate interconnection 41b that vertically overlaps the second gate electrode 23b and the second gate contacts 31b, a second source interconnection 45b that vertically overlaps the second source area 15b and the second source contacts 35b, and a second drain interconnection 46b that vertically overlaps the second drain area 16b and the second drain contacts 36b.

The first gate electrode 23a and the second gate electrode 23b may be disposed in parallel to each other.

The first gate contacts 31a may be disposed on a first virtual gate passing line Yg1 that extends in the Y direction. The first source contacts 35a may be disposed on a first virtual source passing line Ys1 that extends in the Y direction. The first drain contacts 36a may be disposed on a first virtual drain passing line Yd1 that extends in the Y direction. The second gate contacts 31b may be disposed on a second virtual gate passing line Yg2 that extends in the Y direction. The second source contacts 35b may be disposed on a second virtual source passing line Ys2 that extends in the Y direction. The second drain contacts 36b may be disposed on a second virtual drain passing line Yd2 that extends in the Y direction.

The first source contacts 35a and the first gate contacts 31a each may be disposed on first virtual gate/source contact crossing lines Xgs1 and/or on first source contact crossing lines Xs1, each of which extend in an X direction.

The first drain contacts 36a may be disposed on first virtual drain contact crossing lines Xd1 that cross between two adjacent first source contacts 35a and/or between two adjacent first gate contacts 31a. The first virtual drain contact crossing lines Xd1 each extend in the X direction.

The second source contacts 35b, the second gate contacts 31b, and the second drain contacts 36b each may be disposed on second virtual gate/source/drain contact crossing lines Xgsd2 and/or on second virtual source/drain contact crossing lines Xsd2, each of which extend in the X direction.

The first virtual gate/source contact crossing lines Xgs1 extend in the X direction to cross the first gate contacts 31a, and the second virtual gate/source/drain contact crossing lines Xgsd2 extend in the X direction to cross the second gate contacts 31b. Each first virtual gate/source contact crossing line Xgs1 may be substantially aligned with a respective one of the second virtual gate/source/drain contact crossing lines Xgsd2 in the X direction (horizontally). For example, the uppermost (in the +Y direction) first gate contact 31a is disposed on a first virtual gate/source contact crossing line Xgs1 and the uppermost second gate contact 31b is disposed on a second virtual gate/source/drain contact crossing line Xgsd2 that is collinear with the first virtual gate/source contact crossing line Xgs1.

The first drain contacts 36a may be disposed on first drain contact crossing lines Xd1 that each extend in the X direction to cross between two adjacent second source contacts 35b. The second source contacts 35b may be disposed on the second virtual gate/source/drain contact crossing lines Xgsd2 and/or the second virtual source/drain contact crossing lines Xsd2 which each extend in the X direction to cross between two adjacent first drain contacts 36a. The first drain contacts 36a and the second source contacts 35b may be exclusively disposed on the first virtual drain contact crossing lines Xd1 and second virtual source/drain contact crossing lines Xsd2, respectively, each of which extend in the X direction. As shown in FIG. 2A, the first drain contacts 36a and the second source contacts 35b may be disposed in a zigzag pattern in the Y direction.

The first gate interconnection 41a, the first source interconnection 45a, the first drain interconnection 46a, the second gate interconnection 41b, the second source interconnection 45b, and the second drain interconnection 46b may extend in parallel to each other along virtual straight lines Yg1, Ys1, Yd1, Yg2, Ys2, and Yd2, respectively, each of which extend in the Y direction. The first gate interconnection 41a may be parallel to the first gate electrode 23a and may vertically overlap the first gate electrode 23a. The second gate interconnection 41b may be parallel to the second gate electrode 23b and may vertically overlap the second gate electrode 23b. The first source interconnection 45a may be parallel to the first source area 15a and may vertically overlap the first source area 15a. The second source interconnection 45b may be parallel to the second source area 15b and may vertically overlap the second source area 15b. The first drain interconnection 46a may be parallel to the first drain area 16a and may vertically overlap the first drain area 16a. The second drain interconnection 46b may be parallel to the second drain area 16b and may vertically overlap the second drain area 16b.

Figure 2B:
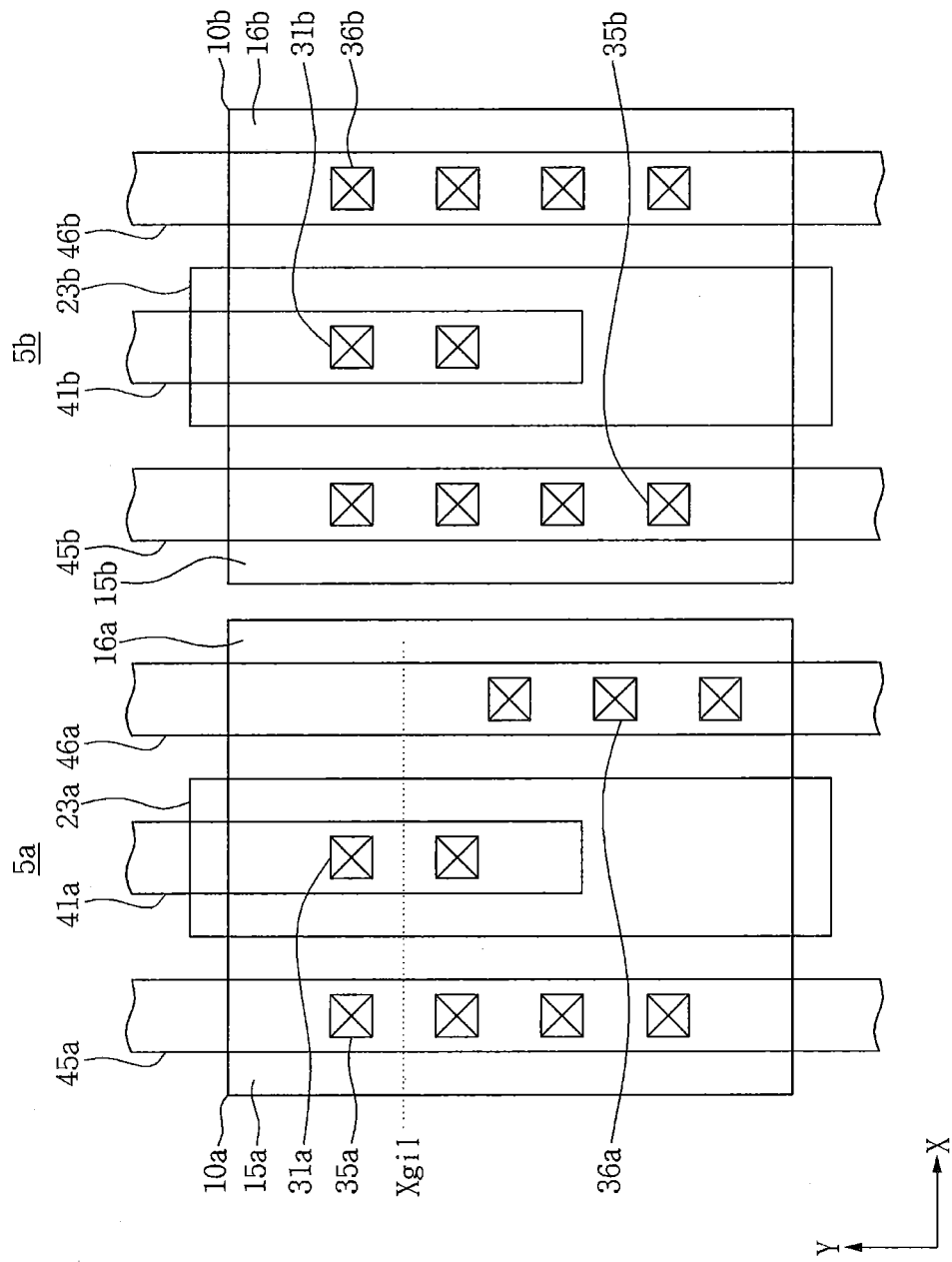

Referring to FIG. 2B, in a MOSFET device in accordance with another embodiment of the inventive concepts, the MOSFET device of FIG. 2A is modified so that the first drain contacts 36a are all located at a lower level than a lowermost one of the first gate contacts 31a in the first drain area 16a.

For example, a first drain contact 36a is not be disposed on a first virtual inter-gate contact line Xgi1 that extends in the X direction to cross between the two adjacent first gate contacts 31a.

Figure 2C:
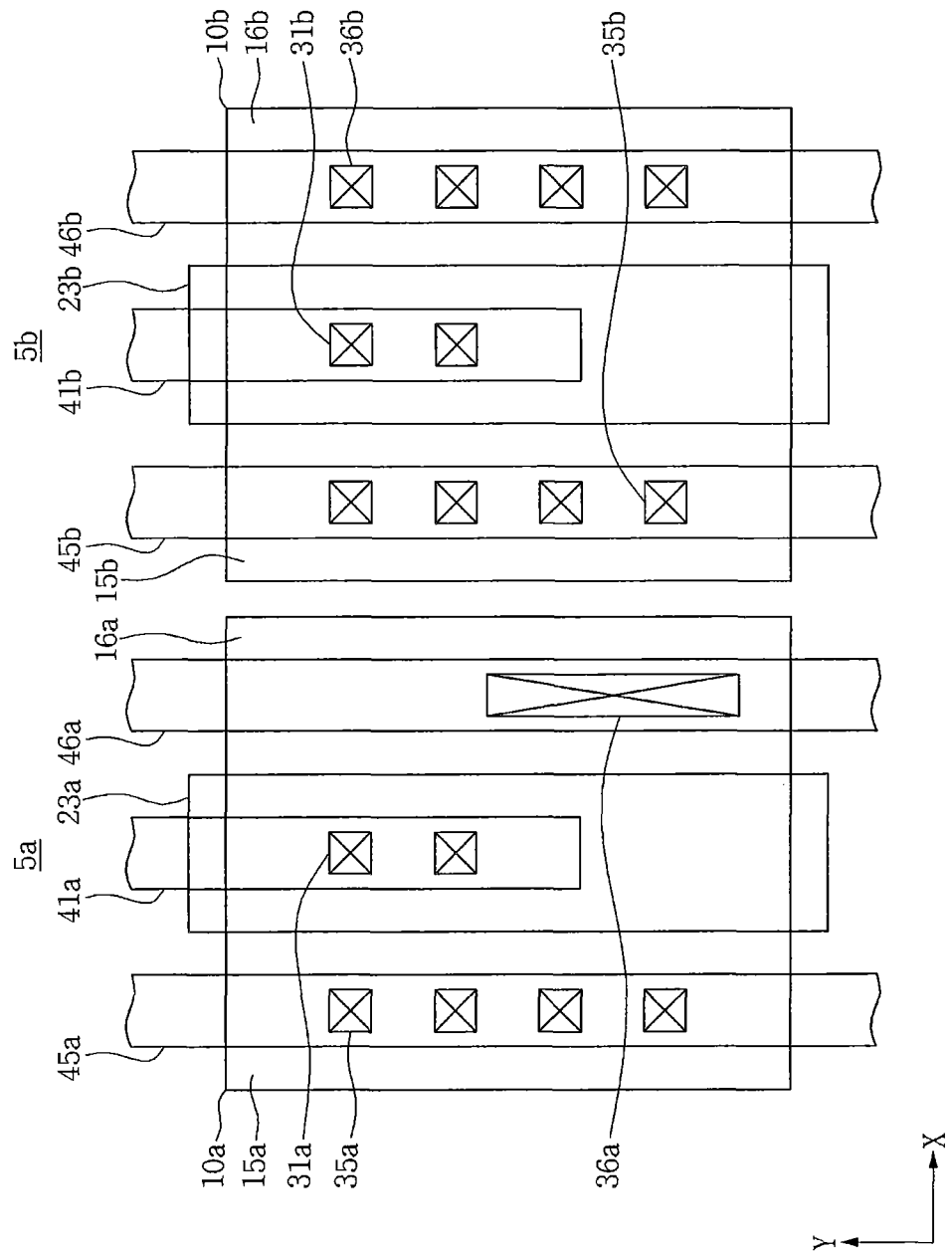

Referring to FIG. 2C, in a MOSFET device in accordance with another embodiment of the inventive concepts, the first drain contacts 36a may be located at a lower level than the lowermost one of the first gate contacts 31a, and may have a bar shape, a rectangular shape or an oval shape.

Figure 2D:
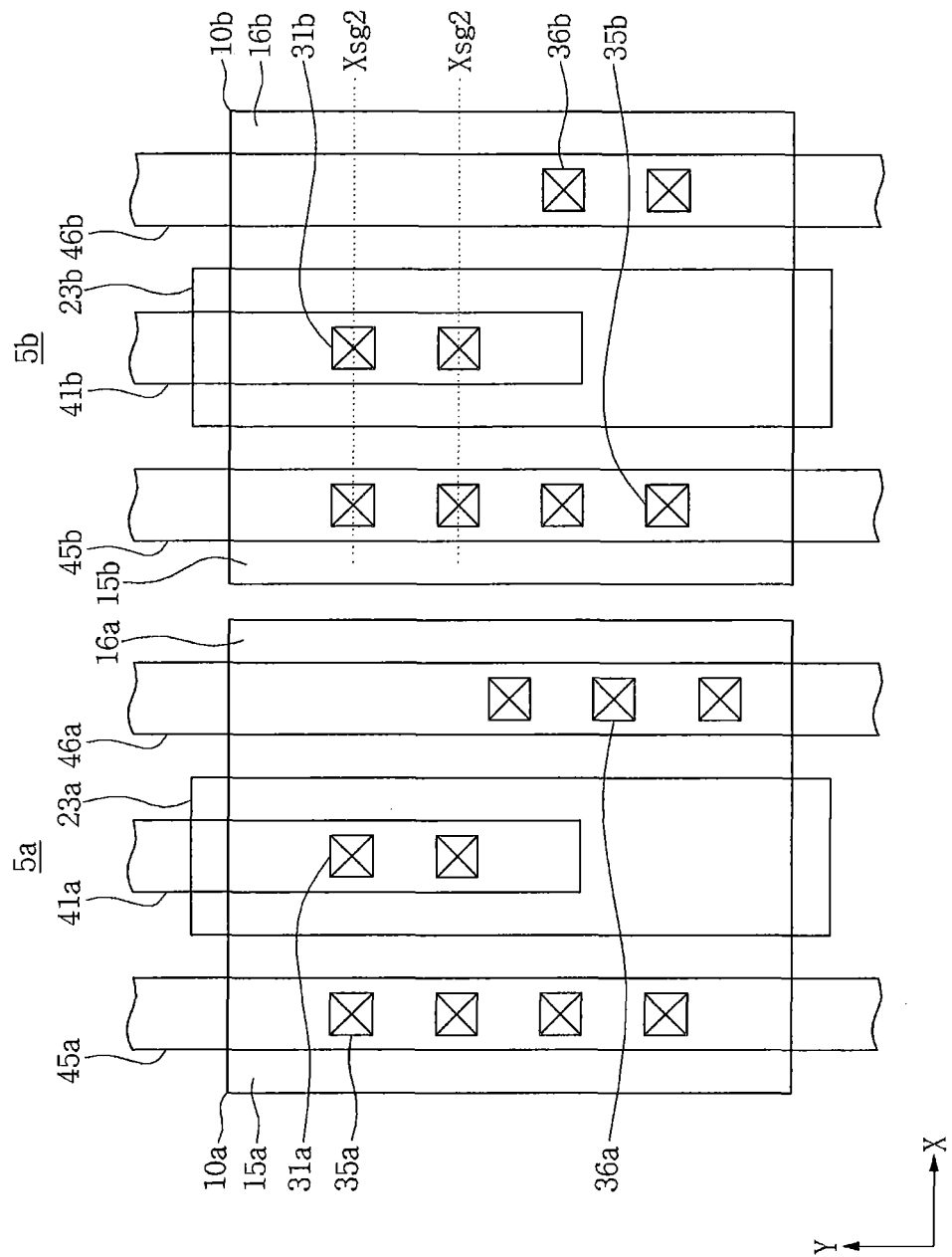

Referring to FIG. 2D, in a MOSFET device in accordance with still another embodiment of the inventive concepts, the second drain contacts 36b may be disposed at a lower level than a lowermost one of the second gate contacts 31b in the second drain area 16b, in contrast to the embodiment of FIG. 2B. In particular, in the embodiment of FIG. 2D, the second drain contacts 36b are not disposed on second virtual source/gate contact crossing lines Xsg2 that extend in the X direction to bisect a respective second source contact 35b and a respective second gate contact 31b.

Figure 2E:
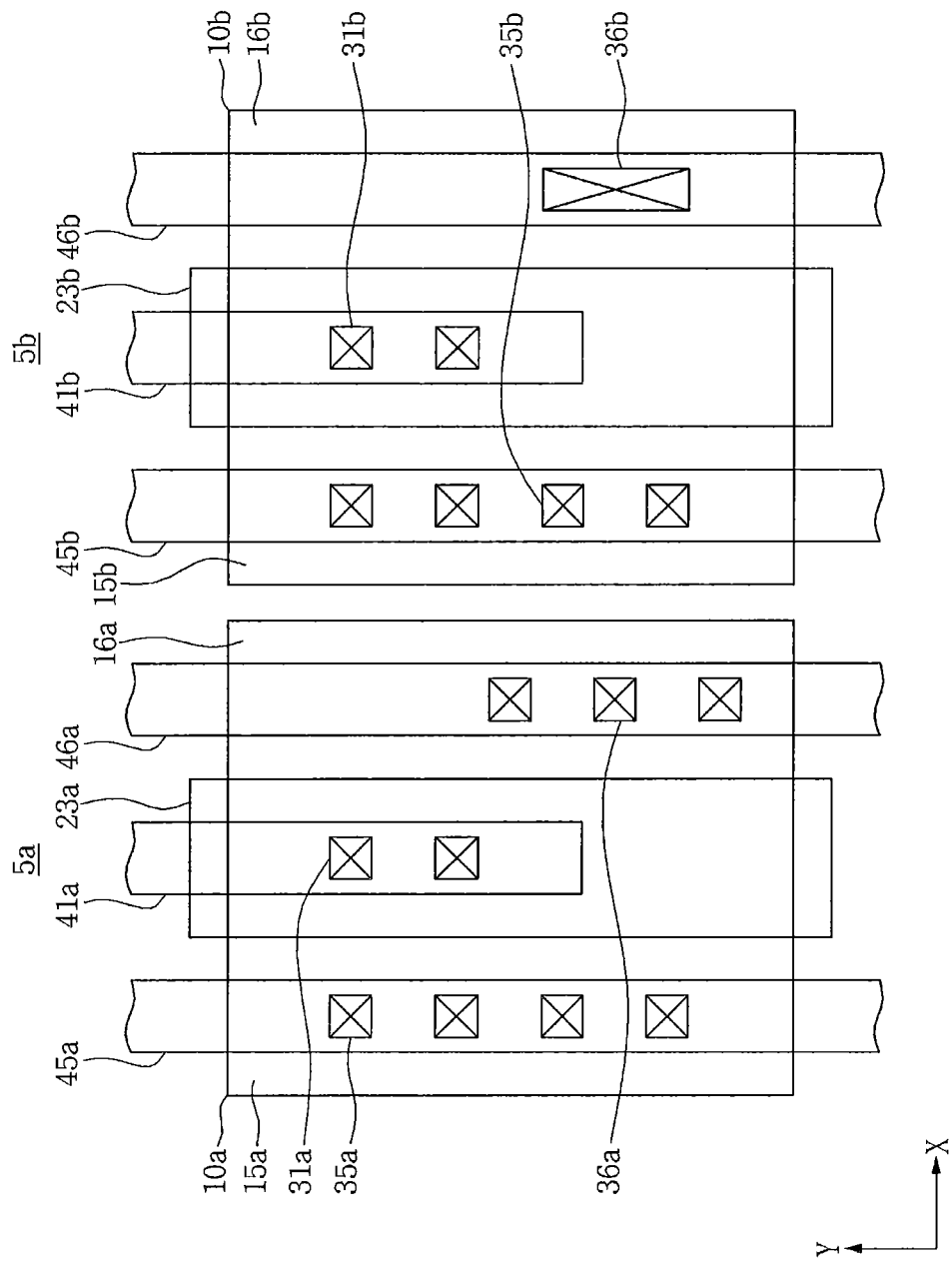

Referring to FIG. 2E, in a MOSFET device in accordance with yet another embodiment of the inventive concepts, the second drain contacts 36b may be located at a lower level than the lowermost one of the second gate contacts 31b as in the embodiment of FIG. 2D, and these second drain contacts may also have a bar shape, a rectangular shape or an oval shape.

Referring to FIG. 2F, in a MOSFET device in accordance with still another embodiment of the inventive concepts, the MOSFET device of FIG. 2B may be modified so that the second gate contacts 31b are not disposed on second virtual source/drain contact crossing lines Xsd2 that each extend in the X direction to cross respective ones of the second source contacts 35b and the second drain contacts 36b. Instead, the second gate contacts 31b may be disposed on second virtual gate contact crossing lines Xg2 that extend in the X direction to cross between two adjacent second source contacts 35b and/or between two adjacent second drain contacts 36b. In other words, the second gate contacts 31b may be shifted in the −Y direction as compared to the first gate contacts 31a, the second source contacts 35b, or the second drain contacts 36b.

Figure 2G:
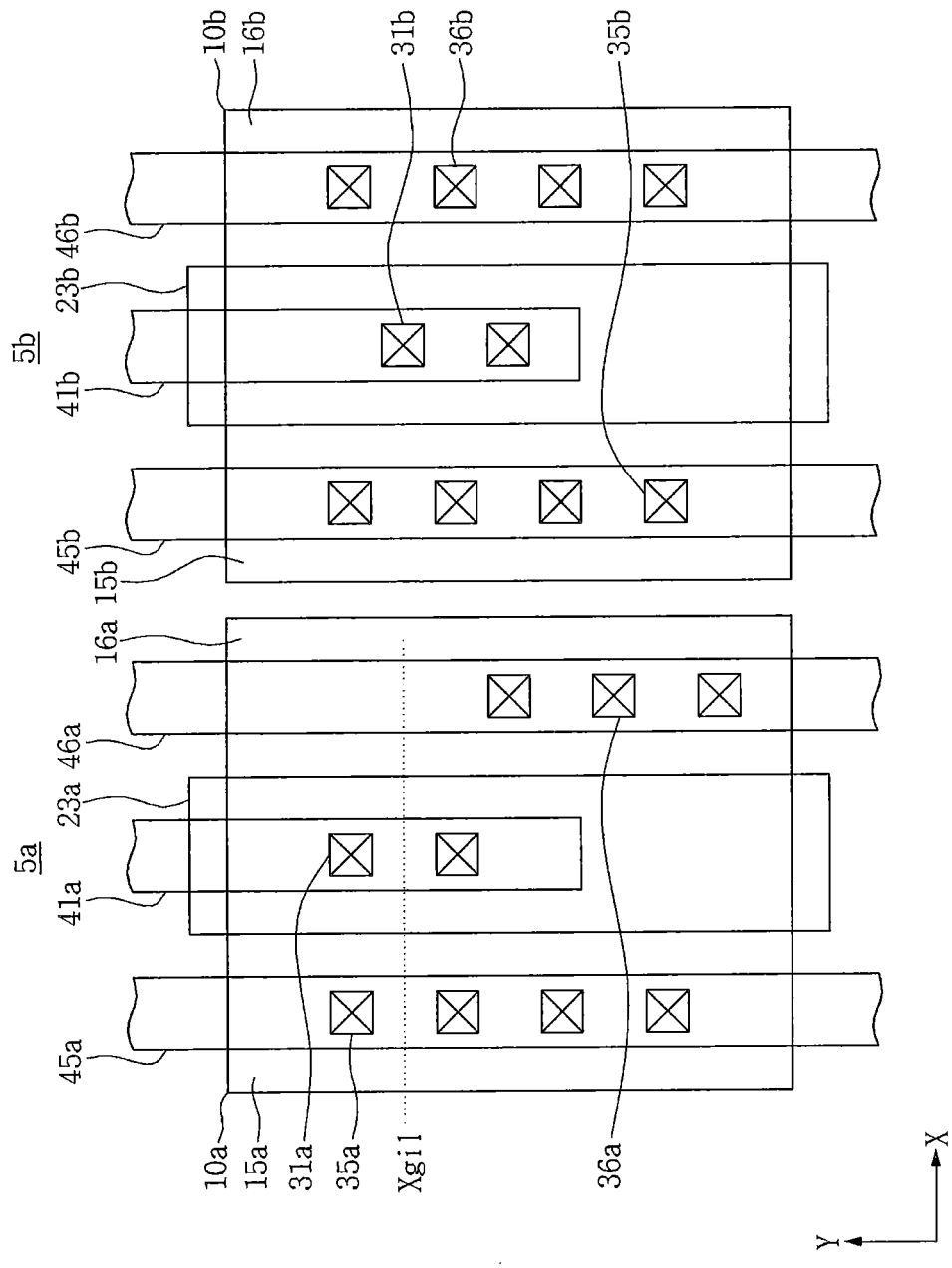

Referring to FIG. 2G, in a MOSFET device in accordance with another embodiment of the inventive concepts, the first drain contacts 36a may be disposed at a lower level than a lowermost one of the first gate contacts 31a in the first drain area 16a. For example, the first drain contacts 36a may not be disposed on a first virtual inter-gate contact line Xgi1 that extends in the X direction to cross between two adjacent first source contacts 35a and between two adjacent first gate contacts 31a.

Figure 2H:
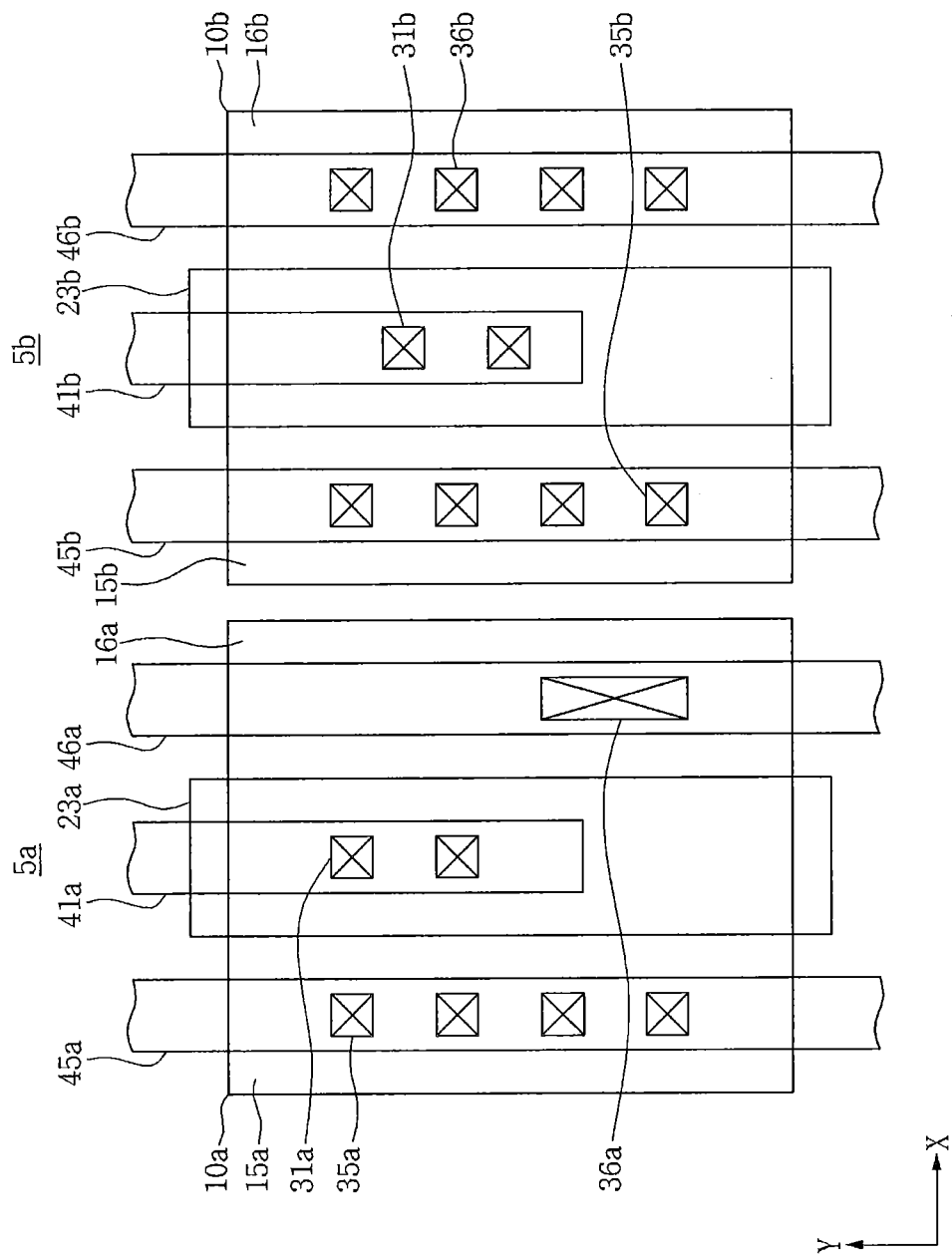

Referring to FIG. 2H, in a MOSFET device in accordance with still another embodiment of the inventive concepts, the first drain contacts 36a of the embodiment of FIG. 2G may be replaced with a drain contact 36a that has a bar shape, a rectangular shape or an oval shape.

Figure 2I:
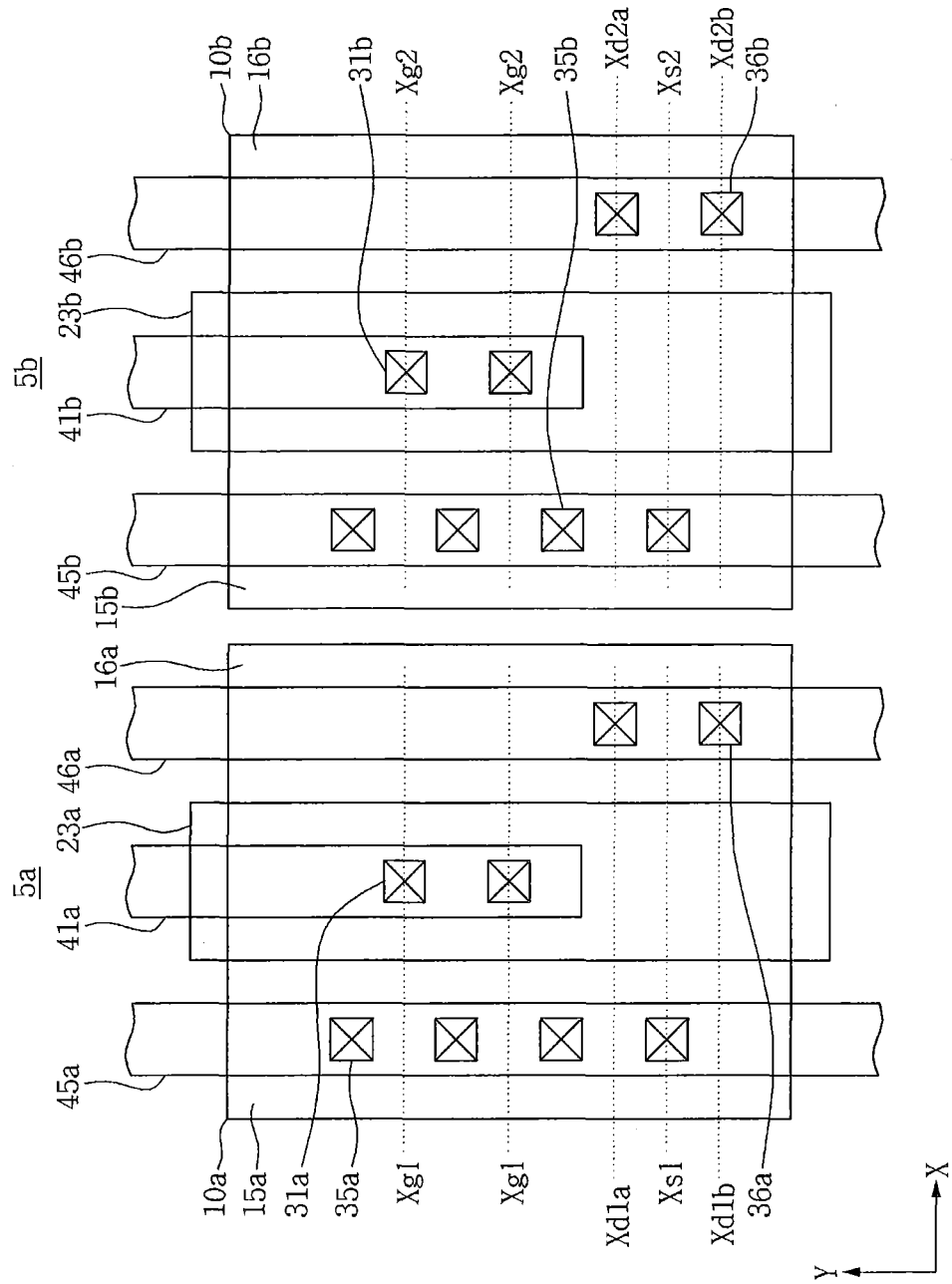

Referring to FIG. 2I, a MOSFET device in accordance with another embodiment of the inventive concepts may include a first MOSFET device 5a including a first active area 10a, a first gate electrode 23a that crosses the first active area 10a in a Y direction to define a first source area 15a and a first drain area 16a, first source contacts 35a disposed on the first source area 15a, first drain contacts 36a disposed on the first drain area 16a, first gate contacts 31a disposed on the first gate electrode 23a, a first gate interconnection 41a that extends in the Y direction parallel to the first gate electrode 23a to vertically overlap the first gate electrode 23a and the first gate contacts 31a, a first source interconnection 45a that extends in the Y direction parallel to the first gate electrode 23a to vertically overlap the first source area 15a and the first source contacts 35a, and a first drain interconnection 46a that extends in the Y direction parallel to the first gate electrode 23a to vertically overlap the first drain area 16a and the first drain contacts 36a. The MOSFET device further includes a second MOSFET device 5b that includes a second active area 10b, a second gate electrode 23b that crosses the second active area 10b in the Y direction to define a second source area 15b and a second drain area 16b, second source contacts 35b disposed on the second source area 15b, second drain contacts 36b disposed on the second drain area 16b, second gate contacts 31b disposed on the second gate electrode 23b, a second gate interconnection 41b that extends in the Y direction parallel to the second gate electrode 23b to vertically overlap the second gate electrode 23b and the second gate contacts 31b, a second source interconnection 45b that extends in the Y direction parallel to the second gate electrode 23b to vertically overlap the second source area 15b and the second source contacts 35b, and a second drain interconnection 46b that extends in the Y direction parallel to the second gate electrode 23b to vertically overlap the second drain area 16b and the second drain contacts 36b.

For example, the first source contacts 35a and the first gate contacts 31a may be disposed in a zigzag pattern in the X direction and/or in the Y direction.

The first drain contacts 36a may be disposed at a lower level than a lowermost one of the first gate contacts 31a in the first drain area 16a. The first drain contacts 36a may be disposed on a first virtual upper drain contact crossing line Xd1a that extends in the X direction to cross between two adjacent first source contacts 35a or on a first virtual lower drain contact crossing line Xd1b that is shifted in the −Y direction from the first virtual source contact crossing line Xs1.

The second gate contacts 31b may be disposed on second virtual gate contact crossing lines Xg2 that each extend in the X direction to cross between two adjacent second source contacts 35b. Thus, the second source contacts 35b and the second gate contacts 31b may be disposed in a zigzag pattern in the X direction and/or in the Y direction.

The second drain contacts 36b may be disposed at a lower level than the lowermost one of the second gate contacts 31b in the second drain area 16b. The second drain contacts 36b may be disposed on a second virtual upper drain contact crossing line Xd2a that crosses between two adjacent second source contacts 35b, or on a second virtual lower drain contact crossing line Xd2b that is shifted in the −Y direction from the second virtual source contact crossing line Xs2. The second virtual source contact crossing line Xs2 extends in the X direction to cross a lowermost one of the second source contacts 35b.

Figure 2J:
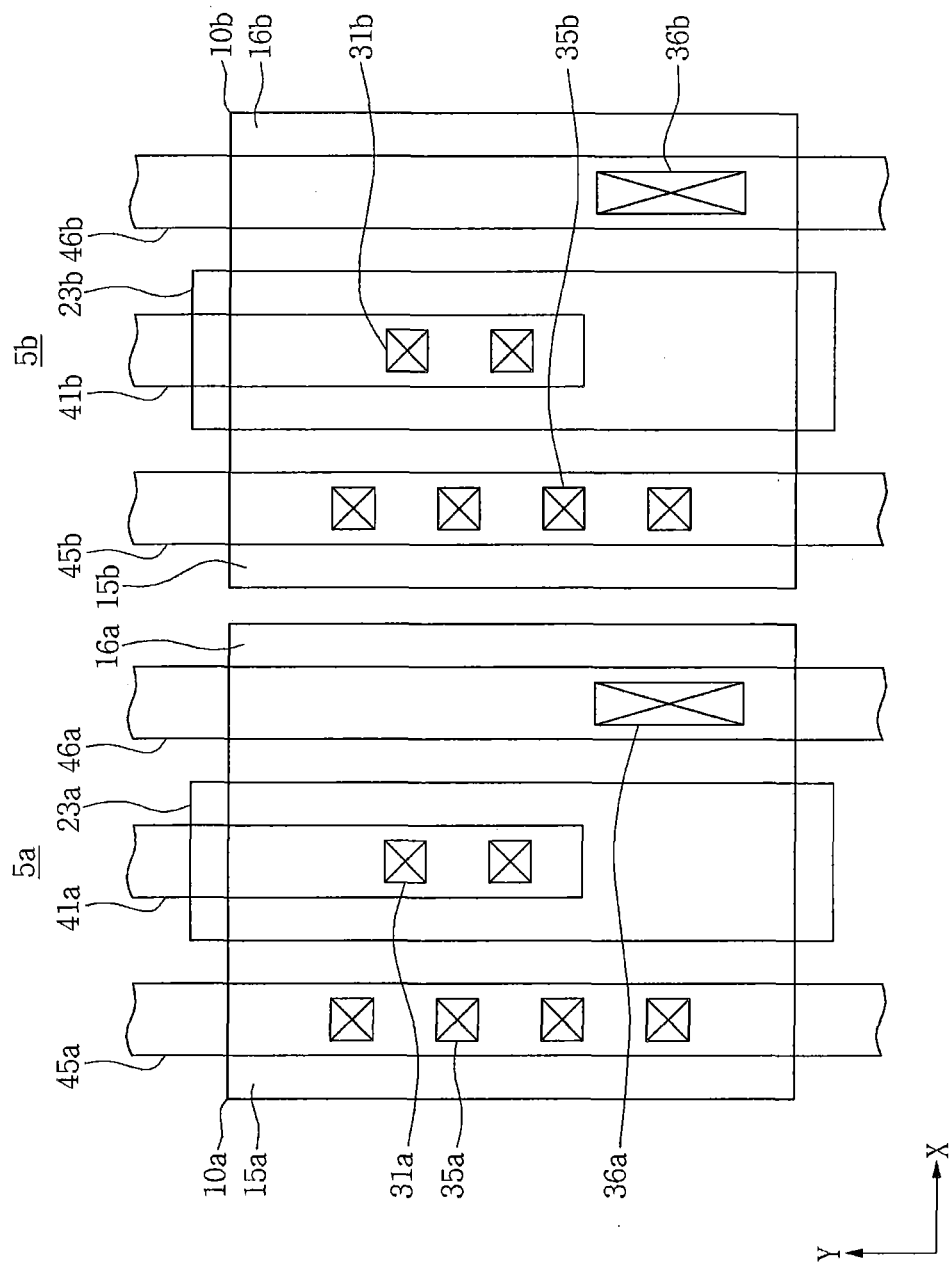

Referring to FIG. 2J, in a MOSFET device in accordance with still another embodiment of the inventive concepts, the MOSFET device of FIG. 2I may be modified so that first drain contacts 36a and the second drain contacts 36b may have a bar shape, a rectangular shape or an oval shape.

Figure 3A:
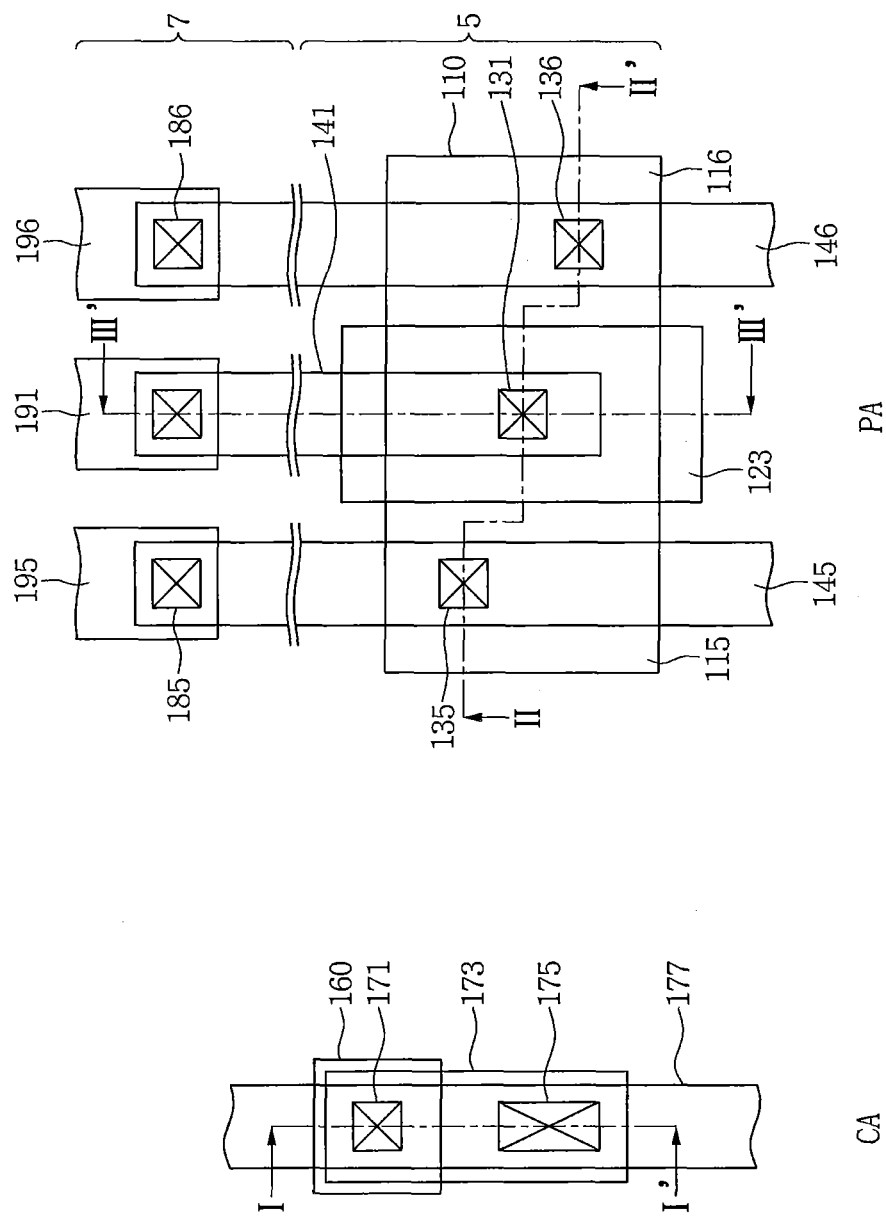
FIG. 3A is a layout of a MOSFET device in accordance with another embodiment of the inventive concepts.
Figure 3B:
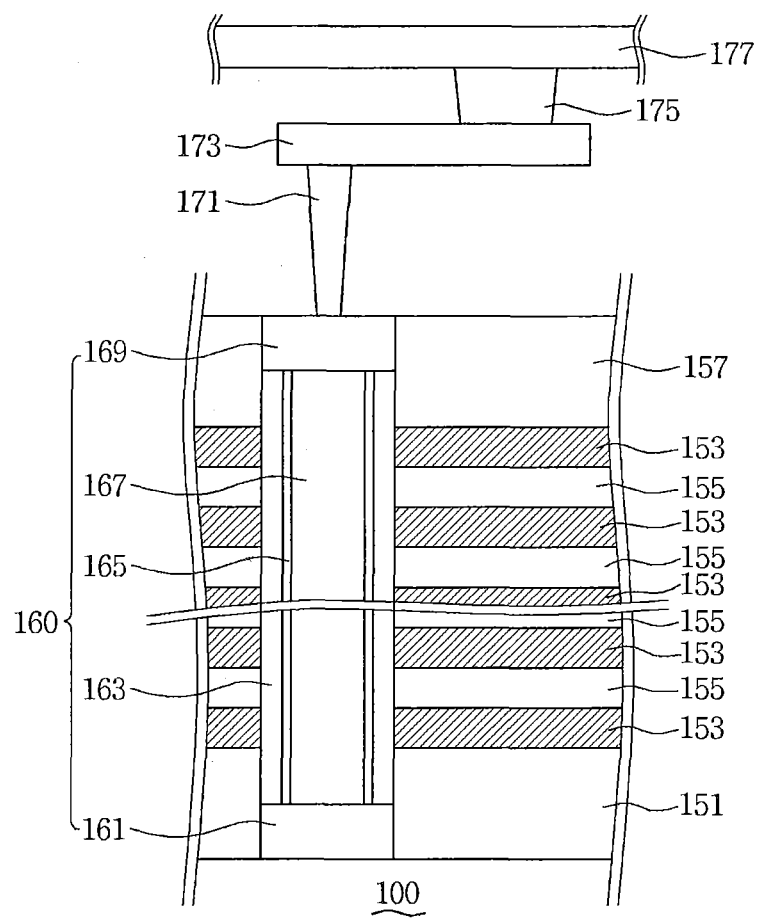
FIGS. 3B to 3D are conceptual vertical cross-sectional views taken along lines I-I', II-II', and III-III' and of FIG. 3A, respectively.
Figure 3C:
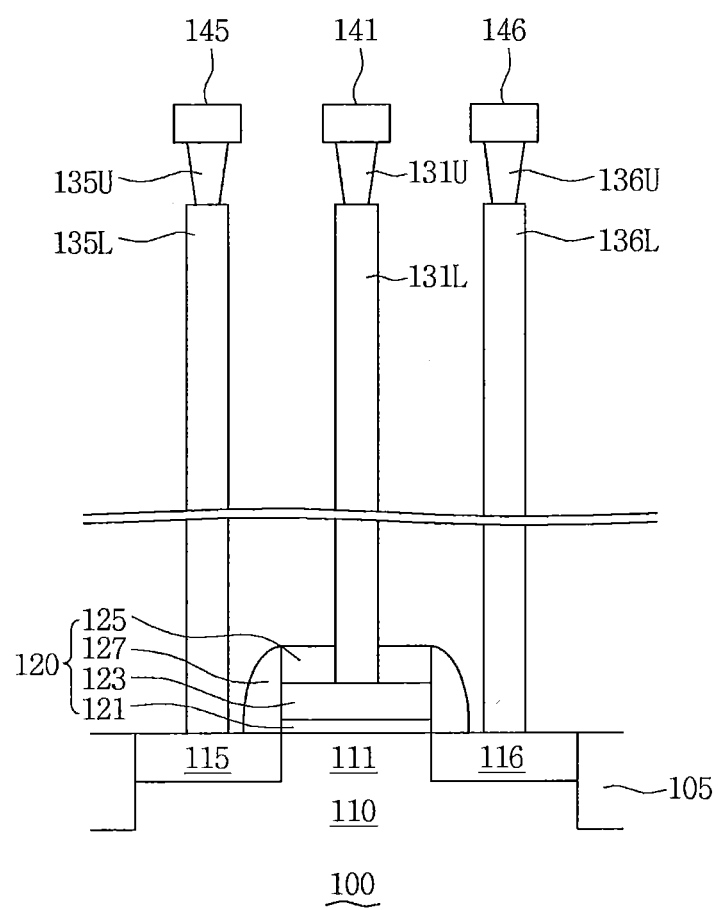
Figure 3D:
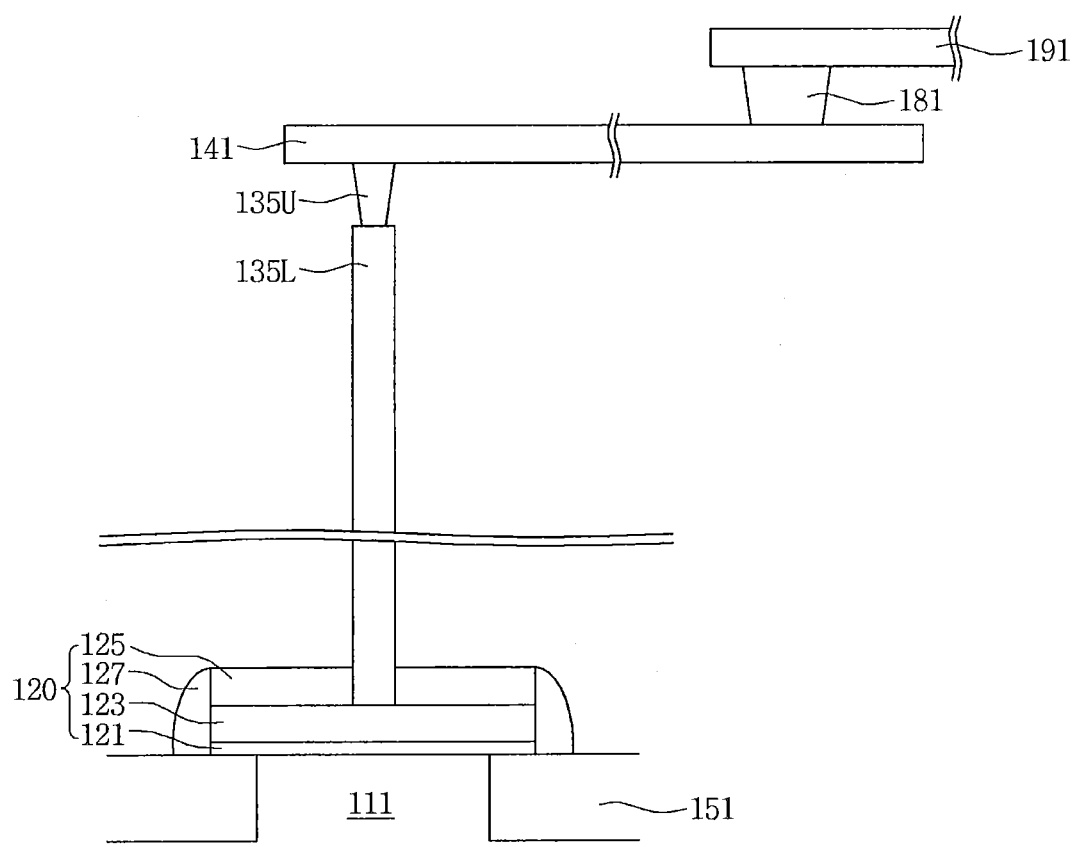

FIG. 3A is a schematic layout showing a MOSFET device in accordance with an embodiment of the inventive concepts, and FIGS. 3B to 3D are conceptual vertical cross-sectional views taken along lines I-I', II-II', and III-III' of FIG. 3A, respectively.

Referring to FIG. 3A, the semiconductor device in accordance with this embodiment of the inventive concepts may include a cell area CA and a peripheral area PA.

A vertical channel 160, a lower bit line contact 171, a bit line pad 173, an upper bit line contact 175, and a bit line 177 may be formed in the cell area CA. The vertical channel 160 and the lower bit line contact 171 may have a rectangular shape or a circular shape. The bit line pad 173 may have an elongated bar shape, a rectangular shape, or an oval shape. The bit line 177 may have a straight line shape and may extend in both directions.

A MOSFET device 5 and logic circuits 7 may be formed in the peripheral area PA.

The MOSFET device 5 may include an active area 110, a gate electrode 123 that crosses the active area 110 to define a source area 115 and a drain area 116, gate contacts 131 disposed on the gate electrode 123, source contacts 135 disposed on the source area 115, drain contacts 136 disposed on the drain area 116, a gate interconnection 141 that vertically overlaps the gate contacts 131 and the gate electrode 123, a source interconnection 145 that vertically overlaps the source contacts 135 and the source area 115, and a drain interconnection 146 that vertically overlaps the drain contacts 136 and the drain area 116. The MOSFET device 5 may be one of the MOSFET devices described in FIGS. 1A to 1L. In order to simplify the discussion, the MOSFET device 5 is simply described to include one gate contact 131, one source contact 135, and one drain contact 136.

The logic circuit 7 may include a gate input/output contact 181 that is disposed on the gate interconnection 141, a gate input/output interconnection 191 that vertically overlaps the gate input/output contact 181, a source input/output contact 185 that is disposed on the source interconnection 145, a source input/output interconnection 195 that vertically overlaps the source input/output contact 185, a drain input/output contact 186 that is disposed on the drain interconnection 146, and a drain input/output interconnection 196 that vertically overlaps the drain input/output contact 186.

Although the bit line 177 is shown in FIG. 3A as being parallel to the gate interconnection 141, the source interconnection 145, the drain interconnection 146, the gate input/output interconnection 191, the source input/output interconnection 195, and the drain input/output interconnection 196, it is not limited thereto.

Referring to FIG. 3B, the MOSFET device 5 may include a lower insulating layer 151 that is formed on a substrate 100, word line electrodes 153 and interlayer insulating layers 155, which are alternately stacked on the lower insulating layer 151, a capping insulating layer 157 that covers the word line electrodes 153 and the interlayer insulating layers 155, and the vertical channel 160 that penetrates the capping insulating layer 157, the word line electrodes 153, the interlayer insulating layers 155, and the lower insulating layer 151 to contact the substrate 100. The MOSFET device 5 further includes the lower bit line contact 171, the bit line pad 173, the upper bit line contact 175, and the bit line 177, which are formed on the vertical channel 160.

The substrate 100 may include a semiconductor wafer. For example, the substrate 100 may include a single-crystalline silicon wafer or a compound semiconductor wafer such as silicon germanium (SiGe).

The lower insulating layer 151 may be formed to be relatively thick on a surface of the substrate 100. The lower insulating layer 151 may include an insulating material such as silicon oxide.

The word line electrodes 153 and the interlayer insulating layers 155 may be alternately stacked. The word line electrodes 153 may include a conductor such as tungsten. A conductive barrier layer (not shown) such as titanium nitride (TiN) or tantalum nitride (TaN) may be further interposed between each word line electrodes 153 and adjacent interlayer insulating layers 155. The interlayer insulating layers 155 may include an insulating material such as silicon oxide.

The capping insulating layer 157 may be formed on an uppermost one of the word line electrodes 153. The capping insulating layer 157 may be formed to be relatively thick.

The vertical channel 160 may include a lower pad layer 161, a charge storage layer 163, a channel layer 165, a core layer 167, and an upper pad layer 169. The lower pad layer 161 may include silicon that may be formed, for example, via an epitaxial growth process. The lower insulating layer 151 may have a sufficient thickness so that the lower pad layer 161 has an appropriate thickness. The lower pad layer 161 may be thinner than the lower insulating layer 151. The charge storage layer 163 may include multiple layers such as a silicon oxide layer, a silicon nitride layer, and a metal oxide layer. The channel layer 165 may include a conductive layer such as silicon. The core layer 167 may include an insulating material such as silicon oxide. The upper pad layer 169 may include a conductive layer such as silicon. The capping insulating layer 157 may have a sufficient thickness so that the upper pad layer 169 has an appropriate thickness.

The lower bit line contact 171 may be vertically aligned on the upper pad layer 169 of the vertical channel 160, and may extend vertically therefrom. The lower bit line contact 171 may include silicide and/or a metal to electrically connect the upper pad layer 169 of the vertical channel 160 to the bit line pad 173.

The bit line pad 173 may extend horizontally to vertically overlap and contact the lower bit line contact 171. The bit line pad 173 may include a conductor such as a metal.

The upper bit line contact 175 may extend horizontally to vertically overlap and contact the bit line pad 173. The upper bit line contact 175 may include a metal.

Referring to FIG. 3C, the MOSFET device 5 may include shallow trench isolations (STIs) 105 that define an active area 110 in the substrate 100, a gate pattern 120 formed on the active area 110, a source area 115, a drain area 116, and a channel area 111 in the active area 110, a lower gate contact 131L and an upper gate contact 131U formed on the gate pattern 120, a lower source contact 135L and an upper source contact 135U formed on the source area 115, a lower drain contact 136L and an upper drain contact 136U formed on the drain area 116, a gate interconnection 141 formed on the upper gate contact 131U, a source interconnection 145 formed on the upper source contact 135U, and a drain interconnection 146 formed on the upper drain contact 136U.

The gate pattern 120 may include a gate insulating layer 121, a gate electrode 123, a gate capping layer 125, and a gate spacer 127. The gate insulating layer 121 may include silicon oxide or metal oxide. The gate electrode 123 may include silicide or a metal such as tungsten. The gate capping layer 125 and the gate spacer 127 may include a relatively rigid insulating material such as silicon nitride.

The active area 110 may include the source area 115 located on one side of the gate electrode 123, the drain area 116 located on the other side of the gate electrode 123 opposite the one side, and the channel area 111 underneath the gate electrode 123.

The lower gate contact 131L may be aligned on the gate pattern 120, and may vertically penetrate the gate capping layer 125 to contact the gate electrode 123. The upper gate contact 131U may be aligned on the lower gate contact 131L.

The lower source contact 135L may be aligned on the source area 115, and may contact the source area 115. The upper source contact 135U may be aligned on the lower source contact 135L.

The lower drain contact 136L may be aligned on the drain area 116, and may contact the drain area 116. The upper drain contact 136U may be aligned on the lower drain contact 136L.

The lower gate contact 131L, the upper gate contact 131U, the lower source contact 135L, the upper source contact 135U, the lower drain contact 136L, and the upper drain contact 136U may include silicide and/or a metal.

The lower gate contact 131L and the upper gate contact 131U, the lower source contact 135L and the upper source contact 135U, and the lower drain contact 136L and the upper drain contact 136U each may be formed as a single body to be physically continuous.

The gate interconnection 141, the source interconnection 145, and the drain interconnection 146 may be vertically aligned with the upper gate contact 131U, the upper source contact 135U, and the upper drain contact 136U, respectively.

Referring to FIG. 3D, the MOSFET device 5 may further include a gate input/output contact 181 and a gate input/output interconnection 191. The gate input/output contact 181 may be formed on or near an end of the gate interconnection 141. The gate input/output interconnection 191 may vertically overlap and contact the gate input/output contact 181, and extend in one direction.

Referring to FIGS. 3A to 3D, the lower gate contact 131L, the lower source contact 135L, and the lower drain contact 136L each may have a height greater than a height of the vertical channel 160.

The lower bit line contact 171 may be at a greater height than the upper gate contact 131U.

The bit line pad 173, the gate interconnection 141, the source interconnection 145, and the drain interconnection 146 may be located at the same level. Therefore, all of the bit line pad 173, the gate interconnection 141, the source interconnection 145, and the drain interconnection 146 may be formed in the same process.

The upper bit line contact 175, the gate input/output contact 181, the source input/output contact 185, and the drain input/output contact 186 may be located at the same level. Therefore, all of the upper bit line contact 175, the gate input/output contact 181, the source input/output contact 185, and the drain input/output contact 186 may be formed in the same process.

The bit line 177, the gate input/output interconnection 191, the source input/output interconnection 195, and the drain input/output interconnection 196 may be located at the same level. Therefore, all of the bit line 177, the gate input/output interconnection 191, the source input/output interconnection 195, and the drain input/output interconnection 196 may be formed in the same process.

FIGS. 4A to 4E are layouts showing MOSFET devices in accordance with further embodiments of the inventive concepts.

Figure 4A:
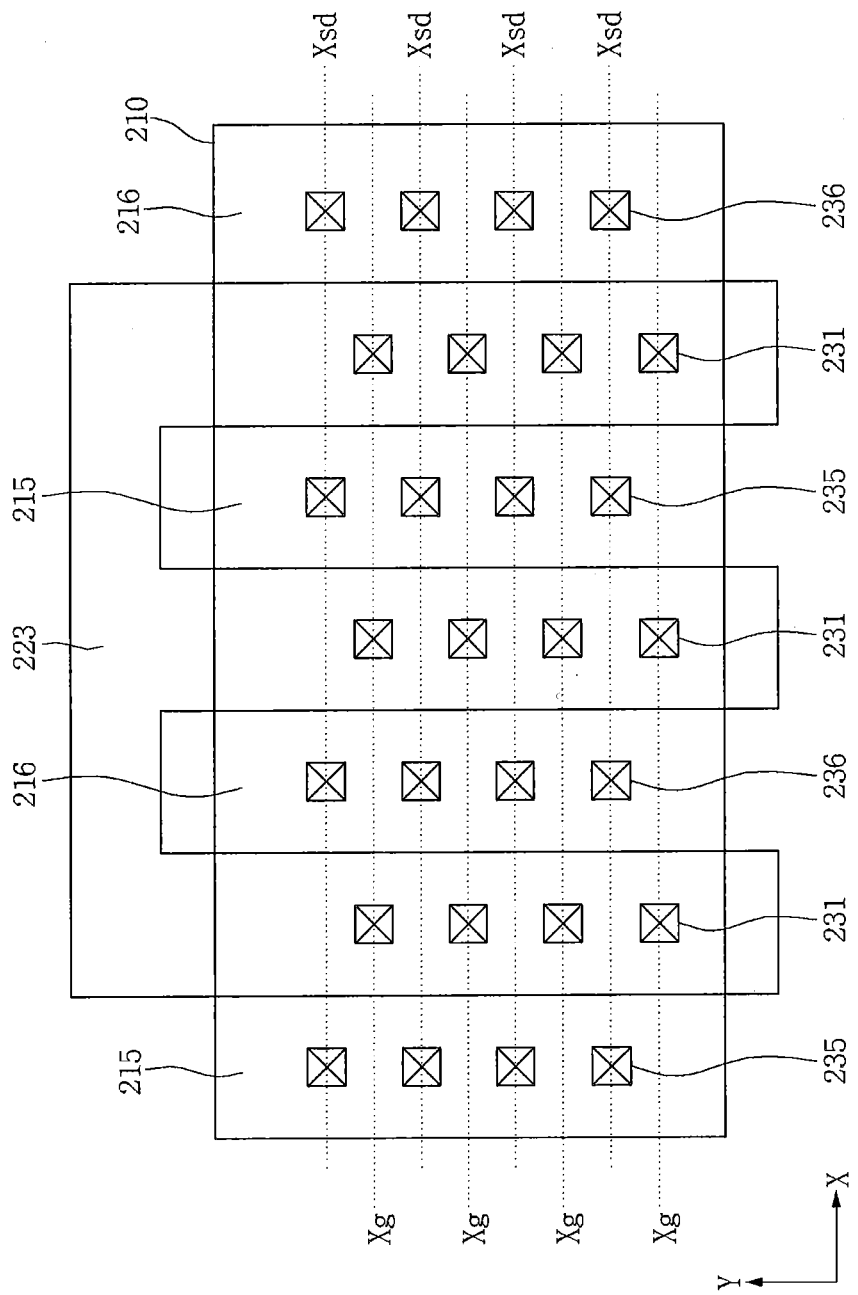

Referring to FIG. 4A, a MOSFET device in accordance with another embodiment of the inventive concepts may include an active area 210, a plurality of gate electrodes 223 that extend in the Y direction to cross the active area 210 to define source areas 215 and drain areas 216, a plurality of gate contacts 231 disposed on the plurality of gate electrodes 223, source contacts 235 disposed on the source areas 215, and drain contacts 236 disposed on the drain areas 216. The plurality of gate electrodes 223 may be electrically and physically connected.

The source contacts 235 and the drain contacts 236 may be disposed on virtual source/drain contact crossing lines Xsd that extend in parallel in the X direction.

The gate contacts 231 may be disposed on virtual gate contact crossing lines Xg that each extend in the X direction to cross between two adjacent source contacts 235 or between two adjacent drain contacts 236. For example, the gate contacts 231 may be shifted in a −Y direction from the virtual source/drain contact crossing lines Xsd.

The gate contacts 231 and the source contacts 235, and the gate contacts 231 and the drain contacts 236 may be disposed in a zigzag pattern in the Y direction.

Figure 4B:
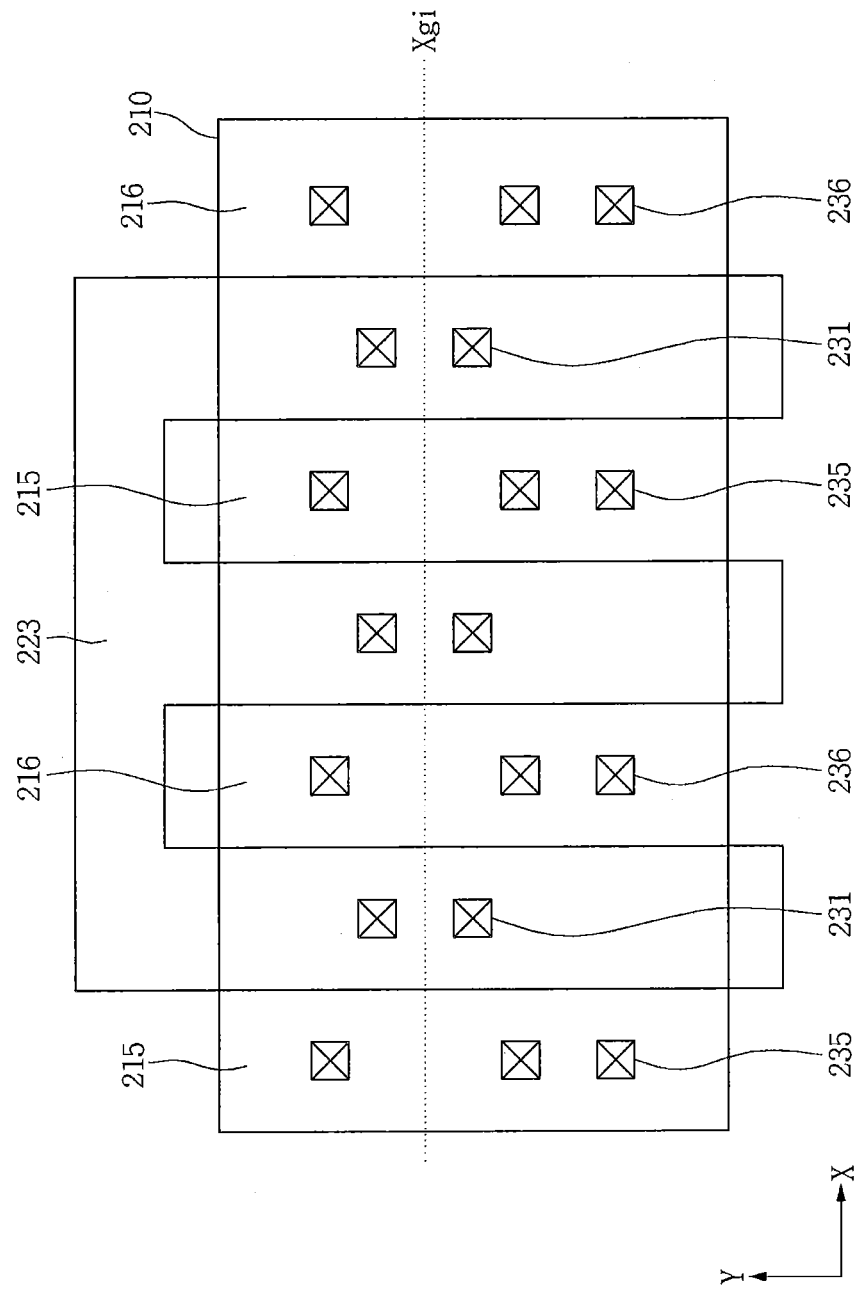

Referring to FIG. 4B, a MOSFET device in accordance with a further embodiment of the inventive concepts may include an active area 210, a plurality of gate electrodes 223 that extend in the Y direction to cross the active area to define a source area 215 and a drain area 216, a plurality of gate contacts 231 disposed on the plurality of gate electrodes 223, source contacts 235 disposed on the source area 215, and drain contacts 236 disposed on the drain area 216. The source contacts 235 and/or the drain contacts 236 may not be disposed on a virtual inter-gate contact line Xgi that extends in the X direction to cross between two adjacent gate contacts 231. Thus, as compared to the embodiment of FIG. 4A, the embodiment of FIG. 4B may not include any source contacts 235 or drain contacts 236 on the virtual inter-gate contact line Xgi that extends in the X direction to cross between the two adjacent gate contacts 231. In addition, in the embodiment of FIG. 4B, some of the gate contacts 231 that are located in a lower area of the active area 210 in the embodiment of FIG. 4A may be omitted. For example, some of the gate contacts 231 disposed in the −Y direction may be omitted.

Figure 4C:
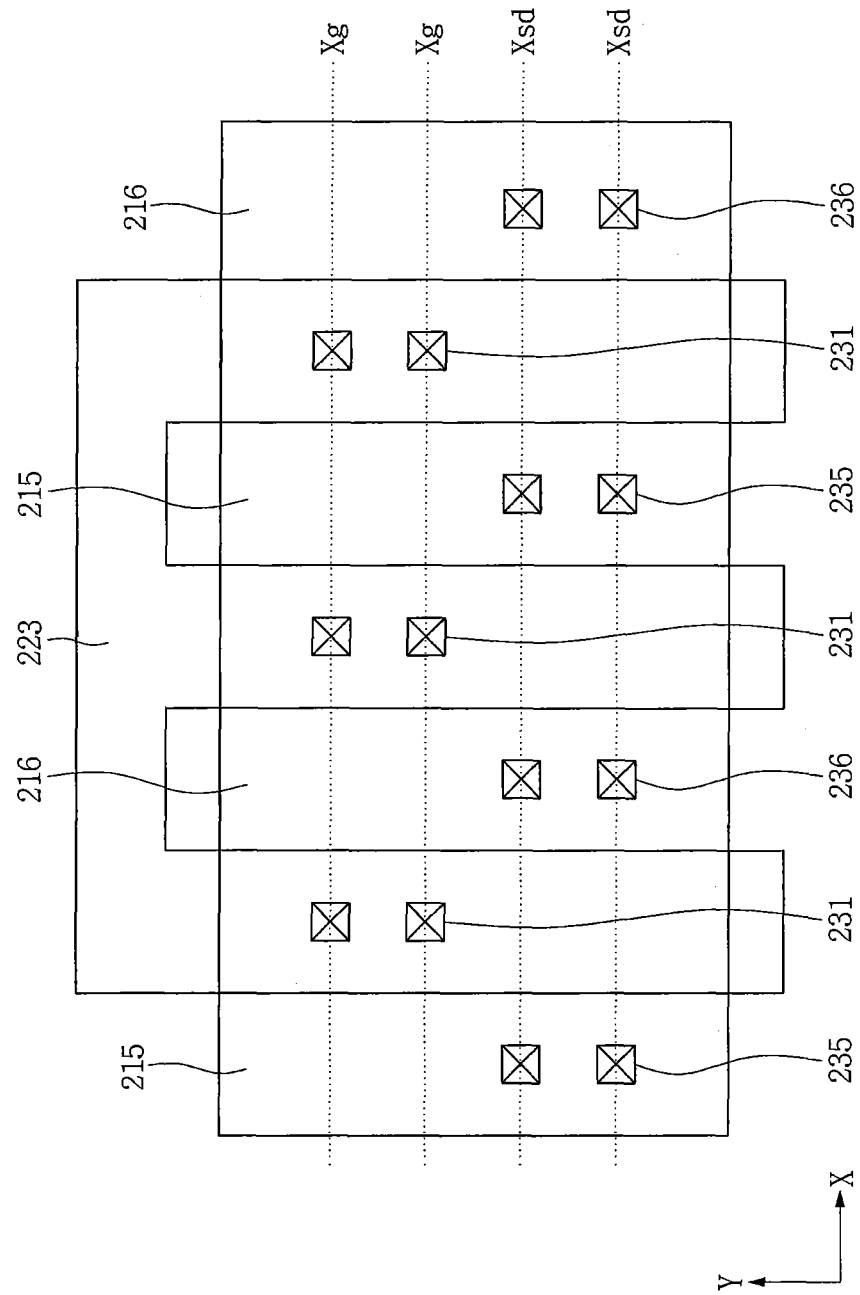

Referring to FIG. 4C, a MOSFET device in accordance with yet another embodiment of the inventive concepts may include an active area 210, a plurality of gate electrodes 223 that extend in the Y direction to cross the active area 210 to define source areas 215 and drain areas 216, a plurality of gate contacts 231 disposed on the plurality of gate electrodes 223, source contacts 235 disposed on the source areas 215, and drain contacts 236 disposed on the drain areas 216. The gate contacts 231 may be disposed on an upper area of the active area 210 or an upper area of the gate electrodes 223 in the Y direction, and the source contacts 235 and the drain contacts 236 may be disposed in lower areas of the source areas 215 and the drain areas 216 in the −Y direction.

For example, the gate contacts 231 and the source contacts 235, or the gate contacts 231 and the drain contacts 236 may be exclusively disposed on virtual gate contact crossing lines Xg and/or virtual source/drain contact crossing lines Xsd, which extend in the X direction.

Referring to FIG. 4D, in a MOSFET device in accordance with a further embodiment of the inventive concepts, the source contacts 235 and/or the drain contacts 236 may have a bar shape, a rectangular shape, or an oval shape that is elongated in the Y direction.

Figure 4E:
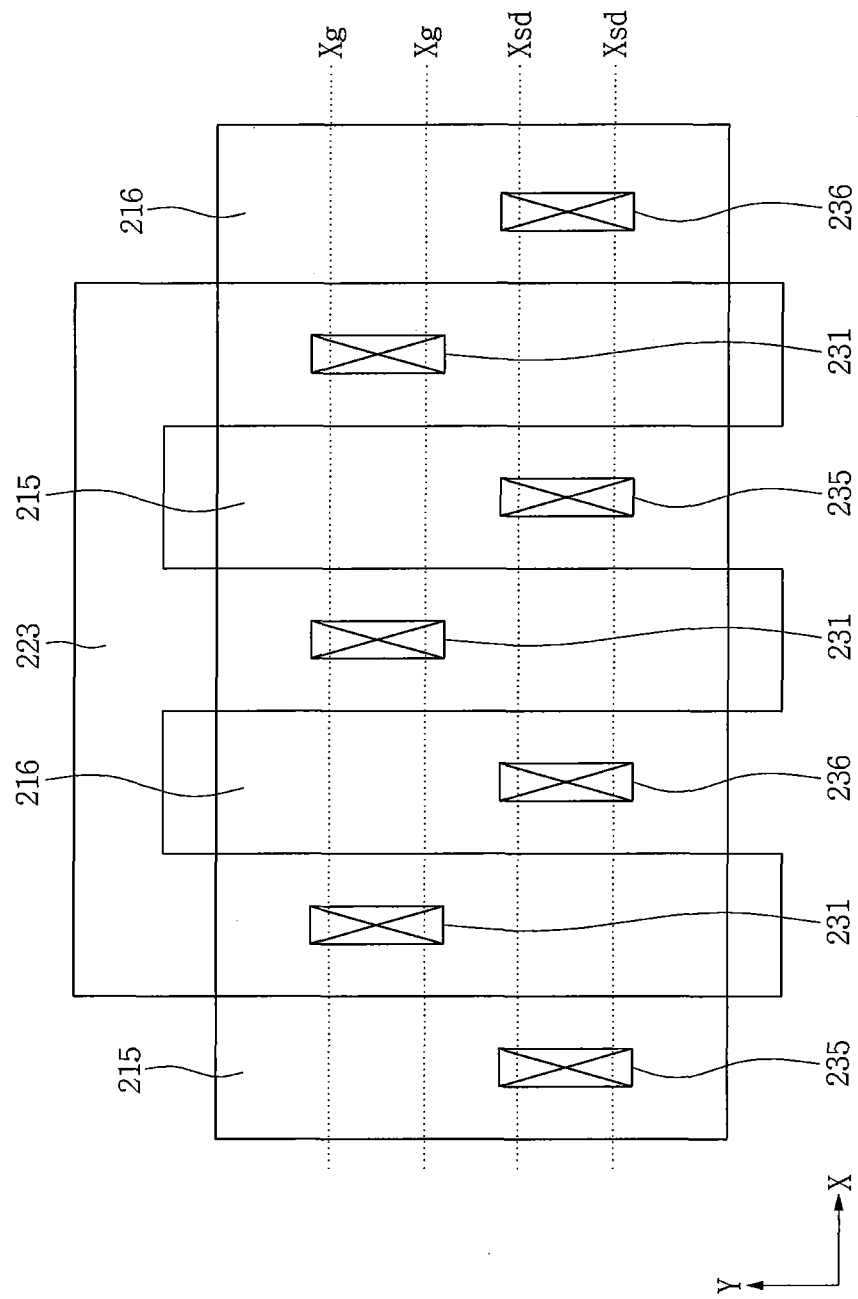

Referring to FIG. 4E, in a MOSFET device in accordance with yet an additional embodiment of the inventive concepts, the gate contacts 231 may have a bar shape, a rectangular shape, or an oval shape elongated in the Y direction.

Figure 5A:
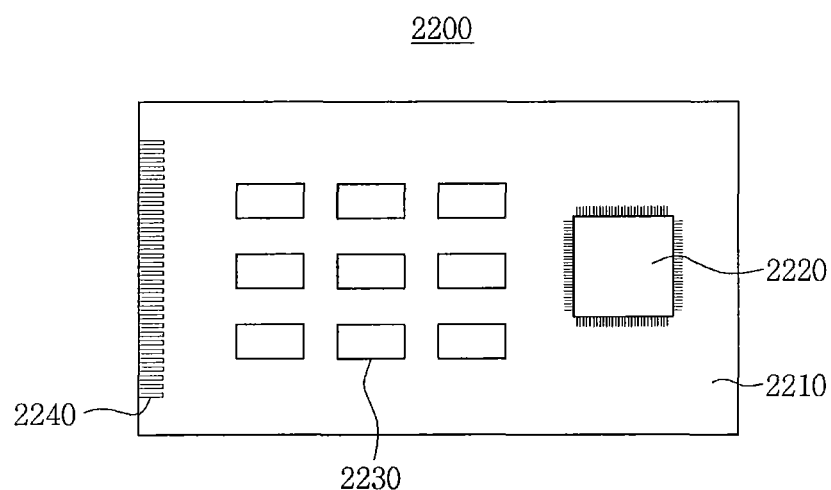
FIG. 5A is a conceptual view showing a semiconductor module in accordance with embodiments of the inventive concepts.

FIG. 5A is a conceptual view showing a semiconductor module 2200 in accordance with an embodiment of the inventive concepts. Referring to FIG. 5A, the semiconductor module 2200 may include a processor 2220 and memory devices 2230 mounted on a semiconductor module substrate 2210. The processor 2220 or the memory devices 2230 may include at least one of the MOSFET devices in accordance with various embodiments of the inventive concepts. Input/output terminals 2240 may be disposed on at least one side of the module substrate 2210.

Figure 5B:
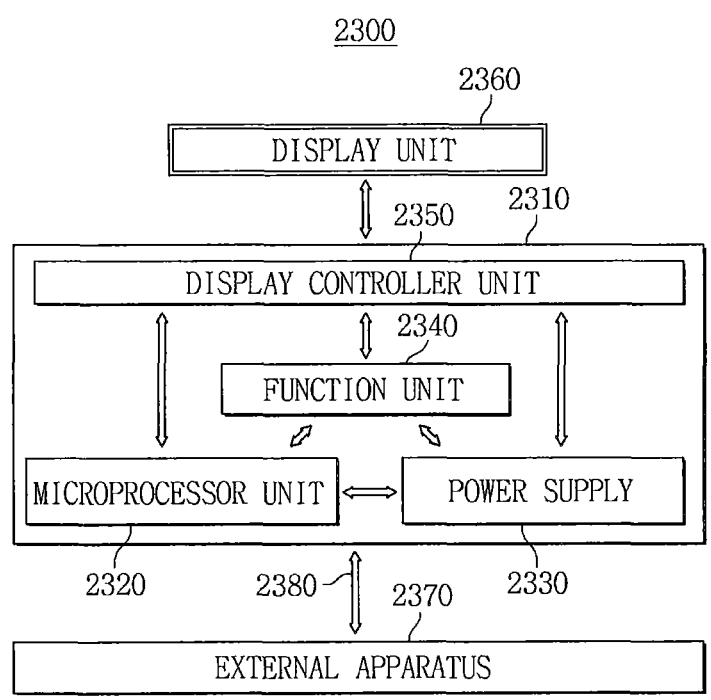
FIGS. 5B and 5C are conceptual block diagrams showing electronic systems in accordance with embodiments of the inventive concepts.

FIG. 5B is conceptual block diagram showing electronic systems 2300 in accordance with an embodiment of the inventive concepts. Referring to FIG. 5B, the electronic system 2300 may include a body 2310, a display unit 2360, and an external apparatus 2370. The body 2310 may include a microprocessor unit 2320, a power supply 2330, a function unit 2340, and/or a display controller unit 2350. The body 2310 may include a system board or a motherboard having a PCB or the like, and/or a case. The microprocessor unit 2320, the power supply 2330, the function unit 2340, and the display controller unit 2350 may be mounted or disposed on an upper surface of the body 2310 or inside the body 2310. The display unit 2360 may be disposed on the upper surface of the body 2310 or inside/outside the body 2310. The display unit 2360 may display an image processed by the display controller unit 2350. For example, the display unit 2360 may include a liquid crystal display (LCD), active matrix organic light emitting diodes (AMOLED), or various display panels. The display unit 2360 may include a touch screen. Therefore, the display unit 2360 may have an input/output function. The power supply 2330 may supply a current or voltage to the microprocessor unit 2320, the function unit 2340, the display controller unit 2350, etc. The power supply 2330 may include a charging battery, a socket for a dry cell, or a voltage/current converter. The microprocessor unit 2320 may receive a voltage from the power supply 2330 to control the function unit 2340 and the display unit 2360. For example, the microprocessor unit 2320 may include a CPU or an application processor (AP). The function unit 2340 may include a touch pad, a touch screen, a volatile/non-volatile memory, a memory card controller, a camera, a light, an audio and moving picture recording processor, a wireless radio antenna, a speaker, a microphone, a USB port, or a unit having other various functions. The microprocessor unit 2320 or the function unit 2340 may include at least one of the MOSFET devices in accordance with embodiments of the inventive concepts.

Figure 5C:
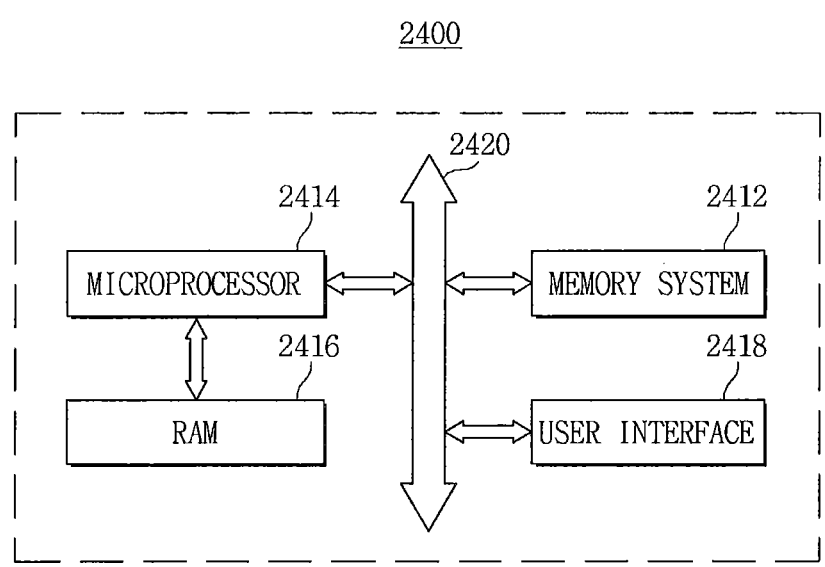

Referring to FIG. 5C, an electronic system 2400 in accordance with further embodiments of the inventive concepts may include a microprocessor 2414, a memory system 2412, and a user interface 2418 configured to perform data communication using a bus 2420. The microprocessor 2414 may include a CPU or an AP. The electronic system 2400 may further include a RAM 2416 configured to directly communicate with the microprocessor 2414. The microprocessor 2414 and/or the RAM 2416 may be assembled within a single package. The user interface 2418 may be used to input data to the electronic system 2400, or output data from the electronic system 2400. For example, the user interface 2418 may include a touch pad, a touch screen, a keyboard, a mouse, a voice detector, a cathode ray tube (CRT) monitor, an LCD, an AMOLED, a plasma display pad (PDP), a printer, a light, or various input/output devices. The memory system 2412 may store operational codes of the microprocessor 2414, data processed by the microprocessor 2414, or data received from the outside. The memory system 2412 may include a memory controller, a hard disk, or a solid state drive (SSD). The microprocessor 2414, the RAM 2416, and/or the memory system 2412 may include at least one of the MOSFET devices in accordance with embodiments of the inventive concepts.

According to the MOSFET devices in accordance with various embodiments of the inventive concept, as distances between the drain contacts and the gate contacts or distances between the source contacts and the gate contacts are increased, a parasitic capacitance formed between the contacts can be reduced. Therefore, operational speeds of the MOSFET devices can be improved, power consumption and malfunctions can be reduced, and the MOSFET devices may be electrically stabilized.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims.

What is claimed is:

1. A metal-oxide-semiconductor field-effect transistor (MOSFET) device, comprising:
a first active area;
a first gate electrode that extends in a Y direction to cross the first active area, the first gate electrode defining a first source area and a first drain area in the first active area;
first gate contacts on the first gate electrode, the first gate contacts aligned on a first virtual gate passing line that extends in the Y direction;
first source contacts on the first source area, the first source contacts aligned on a first virtual source passing line that extends in the Y direction; and
first drain contacts on the first drain area, the first drain contacts aligned on a first virtual drain passing line that extends in the Y direction,
wherein at least one of the first drain contacts is on any one of first virtual lines that extend in parallel in an X direction and that each pass between two adjacent ones of the first source contacts, wherein the X direction is perpendicular to the Y direction.

2. The device according to claim 1, wherein the first gate contacts are disposed on second virtual lines that extend in parallel in the X direction to cross the first source contacts.

3. The device according to claim 2, wherein the first drain contacts are not disposed on a virtual inter-gate contact line that extends in the X direction to pass between the two adjacent first gate contacts.

4. The device according to claim 3, wherein the virtual inter-gate contact line crosses a mid-point of a virtual line that extends between two adjacent first gate contacts.

5. The device according to claim 1, wherein the first source contacts and the first drain contacts are disposed in a zigzag pattern in the Y direction.

6. The device according to claim 1, wherein the first gate contacts and the first drain contacts are disposed in a zigzag pattern in the Y direction.

7. The device according to claim 1, wherein distances between one of the first drain contacts and the two first source contacts that are closest to the one of the first drain contacts are substantially same.

8. The device according to claim 1, wherein the first drain contacts are located at a lower level in the Y direction than the first gate contacts.

9. The device according to claim 8, wherein the first drain contacts have a bar shape, a rectangular shape, or an oval shape in a top view.

10. The device according to claim 1, further comprising:
a second active area adjacent the first active area;
a second gate electrode that extends in the Y direction to cross the second active area, the second gate electrode defining a second source area and a second drain area in the second active area;
second gate contacts on the second gate electrode, the second gate contacts aligned on a second virtual gate passing line that extends in the Y direction;
second source contacts on the second source area, the second source contacts aligned on a second virtual source passing line that extends in the Y direction; and
second drain contacts on the second drain area, the second drain contacts aligned on a second virtual drain passing line that extends in the Y direction,
wherein at least one of the second drain contacts is on any one of the second virtual lines.

11. The device according to claim 10, wherein the first drain area is adjacent the second source area.

12. The device according to claim 10, wherein the first drain contacts and the second source contacts are disposed in a zigzag pattern in the Y direction.

13. The device according to claim 10, wherein the first source area, the first drain area, the second source area, and the second drain area are substantially the same size.

14. The device according to claim 10, wherein distances between the first source contacts and the first gate electrode, distances between the first drain contacts and the first gate electrode, distances between the second sources contact and the second gate electrode, and distances between the second drain contacts and the second gate electrode are substantially the same.

15. A metal-oxide-semiconductor field-effect transistor (MOSFET) device, comprising:
a first active area;
a first gate electrode that extends in a Y direction to cross the first active area, the first gate electrode defining a first source area and a first drain area in the first active area;
first gate contacts on the first gate electrode, the first gate contacts aligned on a first virtual gate passing line that extends in the Y direction;
first source contacts on the first source area, the first source contacts aligned on a first virtual source passing line that extends in the Y direction; and
first drain contacts on the first drain area, the first drain contacts aligned on a first virtual drain passing line that extends in the Y direction, wherein at least some of the first source contacts are aligned in an X direction that is perpendicular to the Y direction with a respective one of the first drain contacts, and wherein the first gate contacts are not aligned in the X direction with either the first source contacts or the first drain contacts.

16. The device according to claim 15, wherein at least one of the first gate contacts is on any one of first virtual lines that extend in parallel in the X direction and that each pass between two adjacent ones of the first source contacts.

17. The device according to claim 15, wherein all of the first drain contacts are on a first side of a virtual line that extends in an X direction and all of the first gate contacts are on an opposite side of the virtual line, wherein the X direction is perpendicular to the Y direction.

18. The device according to claim 17, wherein the first drain contacts have a bar shape, a rectangular shape, or an oval shape.

19. The device according to claim 15, wherein all of the first source contacts are on a first side of a virtual line that extends in an X direction and all of the first gate contacts are on an opposite side of the virtual line, wherein the X direction is perpendicular to the Y direction.

20. The device according to claim 19, wherein the first source contacts have a bar shape, a rectangular shape, or an oval shape.

* * * * *